(12) United States Patent
Kumada et al.

(10) Patent No.: US 9,012,125 B2
(45) Date of Patent: Apr. 21, 2015

(54) RESIST COMPOSITION AND METHOD OF FORMING RESIST PATTERN

(75) Inventors: Shinji Kumada, Kawasaki (JP); Satoshi Maemori, Kawasaki (JP); Masatoshi Arai, Kawasaki (JP); Daiju Shiono, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 97 days.

(21) Appl. No.: 13/343,481

(22) Filed: Jan. 4, 2012

(65) Prior Publication Data

US 2012/0196226 A1 Aug. 2, 2012

(30) Foreign Application Priority Data

Jan. 26, 2011 (JP) ................................ 2011-014447
Nov. 1, 2011 (JP) ................................ 2011-240487

(51) Int. Cl.
*G03F 7/004* (2006.01)
*G03F 7/20* (2006.01)
*G03F 7/039* (2006.01)

(52) U.S. Cl.
CPC .............. *G03F 7/0045* (2013.01); *G03F 7/20* (2013.01); *G03F 7/0397* (2013.01)

(58) Field of Classification Search
None
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,312,867 B1* | 11/2001 | Kinsho et al. | 430/270.1 |
| 6,949,325 B2 | 9/2005 | Li et al. | |
| 7,074,543 B2 | 7/2006 | Iwai et al. | |
| 2001/0049073 A1 | 12/2001 | Hada et al. | |
| 2006/0292490 A1* | 12/2006 | Kodama et al. | 430/270.1 |
| 2008/0187860 A1 | 8/2008 | Tsubaki et al. | |
| 2009/0053650 A1* | 2/2009 | Irie | 430/285.1 |
| 2009/0280434 A1* | 11/2009 | Harada et al. | 430/270.1 |
| 2010/0266957 A1* | 10/2010 | Harada et al. | 430/285.1 |
| 2010/0304295 A1* | 12/2010 | Kinsho et al. | 430/270.1 |

FOREIGN PATENT DOCUMENTS

| | | |
|---|---|---|
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-206694 | 7/2000 |
| JP | A-2003-241385 | 8/2003 |
| JP | 2005077738 A * | 3/2005 |
| JP | A-2005-336452 | 12/2005 |
| JP | A-2006-259582 | 9/2006 |
| JP | A-2006-317803 | 11/2006 |
| JP | A-2008-292975 | 12/2008 |
| WO | WO 2004/074242 A2 | 9/2004 |
| WO | WO 2008/023750 A1 | 2/2008 |

OTHER PUBLICATIONS

Machine translation JP 2005-077738. Mar. 24, 2005.*

* cited by examiner

*Primary Examiner* — Anca Eoff
*Assistant Examiner* — Alyssa L Cepluch
(74) *Attorney, Agent, or Firm* — Knobbe Martens Olson & Bear LLP

(57) ABSTRACT

A resist composition including a base component (A), which exhibits changed solubility in a developing solution under the action of acid and can be used in a lithography process that employs light having a wavelength of 193 nm or less as the exposure light source, an acid generator component (B) which generates acid upon exposure, and a polymeric compound (C) having a structural unit (c0) represented by general formula (c0) shown below, wherein the amount of the polymeric compound (C) is less than 25 parts by mass relative to 100 parts by mass of the base component (A).

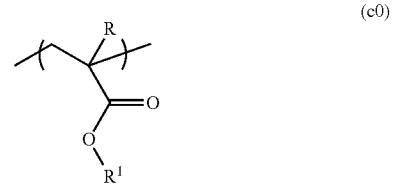

(c0)

In the formula, R represents a hydrogen atom, an alkyl group of 1 to 5 carbon atoms or a halogenated alkyl group of 1 to 5 carbon atoms, and $R^1$ represents an organic group having one or more primary or secondary alcoholic hydroxyl groups, or a chain-like tertiary alcoholic hydroxyl group.

7 Claims, No Drawings

RESIST COMPOSITION AND METHOD OF FORMING RESIST PATTERN

TECHNICAL FIELD

The present invention relates to a resist composition and a method of forming a resist pattern using the resist composition.

Priority is claimed on Japanese Patent Application No. 2011-014447, filed Jan. 26, 2011, and Japanese Patent Application No. 2011-240487, filed Nov. 1, 2011, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these pattern miniaturization techniques involve shortening the wavelength (and increasing the energy) of the exposure light source. Conventionally, ultraviolet radiation typified by g-line and i-line radiation has been used, but nowadays KrF excimer lasers (wavelength: 248 nm) and ArF excimer lasers (wavelength: 193 nm) are starting to be introduced in the mass production of semiconductor elements. Furthermore, research is also being conducted into lithography techniques that use an exposure light source having a shorter wavelength (and a higher energy level) than these excimer lasers, such as electron beam (EB), extreme ultraviolet radiation (EUV), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits changed solubility in a developing solution under the action of acid and an acid generator component that generates acid upon exposure.

For example, in the case where the developing solution is an alkali developing solution (namely, an alkali developing process), a positive-type chemically amplified resist composition containing a resin component (base resin) which exhibits increased solubility in an alkali developing solution under the action of acid, and an acid generator component is typically used. If the resist film formed using this resist composition is selectively exposed during formation of a resist pattern, then within the exposed portions, acid is generated from the acid generator component, and the action of this acid causes an increase in the solubility of the resin component in an alkali developing solution, making the exposed portions soluble in the alkali developing solution. The unexposed portions remain as a pattern, resulting in the formation of a positive-type pattern. The base resin uses a resin for which the polarity increases under the action of acid, resulting in an increase in the solubility of the resin in an alkali developing solution, but a decrease in the solubility of the resin within organic solvents. Accordingly, if a process that uses a developing solution containing an organic solvent (an organic developing solution) is employed (hereinafter also referred to as a solvent developing process or negative-type developing process) instead of the alkali developing process, then within the exposed portions of the resist film, the solubility in the organic developing solution decreases relatively, meaning that during the solvent developing process, the unexposed portions of the resist film are dissolved in the organic developing solution and removed, whereas the exposed portions remain as a pattern, resulting in the formation of a negative-type pattern. Patent Document 1 proposes a negative-type developing process.

Currently, resins that contain structural units derived from (meth)acrylate esters within the main chain (acrylic resins) are widely used as base resins for resist compositions that use ArF excimer laser lithography or the like, as they exhibit excellent transparency in the vicinity of 193 nm (for example, see Patent Document 2).

In recent years, as the demand for high-resolution resist patterns of 0.15 microns or finer has grown, improvements are required not only in the types of lithography properties described above, but also in the level of defects (surface defects) generated following developing. These defects refer to general anomalies within a resist film that are detected when the developed resist pattern is observed from directly above using a surface defect detection apparatus (product name: "KLA") manufactured by KLA-Tencor Corporation. Examples of these anomalies include post-developing scum, foam, dust, and bridges that link different portions of the resist pattern.

In recent years, in the production of semiconductor elements, liquid crystal display elements and MEMS (Micro Electro Mechanical Systems) and the like, an impurity diffusion layer is frequently formed on the surface of the support. The formation of an impurity diffusion layer typically includes the two stages of impurity introduction and diffusion, and one example of a method of introducing the impurity is an ion implantation process in which an impurity such as phosphorus or boron is ionized within a vacuum, and the ions are then accelerated by a strong electric field and driven into the surface of the support.

A resist pattern formed on a support using a chemically amplified resist composition is widely used as a mask during etching of the support (substrate). Recently, resist patterns have also started to be used, within the aforementioned ion implantation process, as a mask that enables the impurity ions to be driven selectively into the implantation support surface.

As a composition for use within an ion implantation process, a radiation-sensitive resin composition for ion implantation has been disclosed that includes a (meth)acrylate ester resin containing an acid-dissociable group which becomes alkali-soluble upon dissociation of the acid-dissociable group, an acid generator, and a phenyl group-containing low molecular weight compound that generates no new acid upon exposure to radiation (see Patent Document 3).

PRIOR ART DOCUMENTS

Patent Documents
Patent Document 1
Japanese Unexamined Patent Application, First Publication No. 2008-292975
Patent Document 2
Japanese Unexamined Patent Application, First Publication No. 2003-241385
Patent Document 3
International Patent Publication No. 2008/023750 pamphlet

DISCLOSURE OF INVENTION

Problems to be Solved by the Invention

As further progress is made in lithography techniques, and as resist patterns become ever finer, resist materials will require further improvements in all manner of lithography properties and further reductions in scum.

Further, in the type of ion implantation applications described above, in order to prevent the ions from being masked by an antireflection film, such an antireflection film cannot be formed on the support on which the resist pattern is formed. This lack of an antireflection film means that if a conventional chemically amplified resist composition is used in an ion implantation process, problems such as inadequate adhesion of the resist composition to the support such as the substrate, and a tendency for resist composition detachment have tended to occur. In particular, in those cases where a base resin having a structural unit derived from a (meth)acrylate ester is used, the base resin exhibits poor adhesion to the substrate, and therefore in lithography operations that use an ArF excimer laser or the like as the exposure light source, which frequently use this type of base resin, (although the transparency of the base resin to the exposure wavelength is good) these problems are particularly marked. On the other hand, in the composition for ion implantation disclosed in Patent Document 3, the addition of the phenyl group-containing low molecular weight compound causes a deterioration in the transparency of the resist composition to light such as an ArF excimer laser, meaning there is still room for improvement in terms of the lithography properties.

The present invention takes the above circumstances into consideration, with an object of providing a resist composition that exhibits excellent lithography properties and adhesion, and reduced scum generation, as well as providing a method of forming a resist pattern that uses the resist composition.

Means to Solve the Problems

In order to achieve the above object, the present invention adopts the aspects described below.

Namely, a first aspect of the present invention is a resist composition including a base component (A), which exhibits changed solubility in a developing solution under the action of acid and can be used in a lithography process that employs light having a wavelength of 193 nm or less as the exposure light source, an acid generator component (B) which generates acid upon exposure, and a polymeric compound (C) having a structural unit (c0) represented by general formula (c0) shown below, wherein the amount of the polymeric compound (C) is less than 25 parts by mass relative to 100 parts by mass of the base component (A).

[Chemical Formula 1]

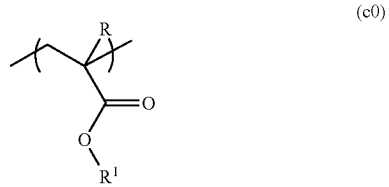

(c0)

In the formula, R represents a hydrogen atom, an alkyl group of 1 to 5 carbon atoms or a halogenated alkyl group of 1 to 5 carbon atoms, and $R^1$ represents an organic group having one or more primary or secondary alcoholic hydroxyl groups, or a chain-like tertiary alcoholic hydroxyl group.

A second aspect of the present invention is a method of forming a resist pattern, the method including: using the resist composition of the first aspect to form a resist film on a support, conducting exposure of the resist film, and developing the resist film to form a resist pattern.

In the present description and claims, the term "aliphatic" is a relative concept used in relation to the term "aromatic", and defines a group or compound that has no aromaticity.

The term "alkyl group" includes linear, branched and cyclic monovalent saturated hydrocarbon groups, unless specified otherwise. The same applies for the alkyl group within an alkoxy group.

The term "alkylene group" includes linear, branched and cyclic divalent saturated hydrocarbon groups, unless specified otherwise.

A "halogenated alkyl group" is a group in which part or all of the hydrogen atoms of an alkyl group have each been substituted with a halogen atom. Examples of the halogen atom include a fluorine atom, chlorine atom, bromine atom and iodine atom.

A "fluorinated alkyl group" or a "fluorinated alkylene group" is a group in which part or all of the hydrogen atoms of an alkyl group or an alkylene group have each been substituted with a fluorine atom.

The term "structural unit" refers to a monomer unit that contributes to the formation of a polymeric compound (a resin, polymer or copolymer).

The term "acrylate ester" describes a compound in which the hydrogen atom at the carboxyl group terminal of acrylic acid ($CH_2=CH-COOH$) has been substituted with an organic group.

A "structural unit derived from an acrylate ester" refers to a structural unit that is formed by the cleavage of the ethylenic double bond of an acrylate ester.

In an "acrylate ester in which the hydrogen atom bonded to the carbon atom on the α-position may be substituted with a substituent", examples of the substituent include a halogen atom, an alkyl group of 1 to 5 carbon atoms, a halogenated alkyl group of 1 to 5 carbon atoms, and a hydroxyalkyl group. The carbon atom on the α-position of a structural unit derived from an acrylate ester (the α-position carbon atom) refers to the carbon atom bonded to the carbonyl group, unless specified otherwise.

Examples of the halogen atom for the substituent which may be bonded to the carbon atom on the α-position include a fluorine atom, chlorine atom, bromine atom and iodine atom.

Specific examples of the alkyl group of 1 to 5 carbon atoms for the substituent which may be bonded to the carbon atom on the α-position include linear or branched alkyl groups such as a methyl group, ethyl group, propyl group, isopropyl group, n-butyl group, isobutyl group, tert-butyl group, pentyl group, isopentyl group and neopentyl group.

Specific examples of the halogenated alkyl group of 1 to 5 carbon atoms for the substituent which may be bonded to the carbon atom on the α-position include groups in which part or all of the hydrogen atoms of an aforementioned "alkyl group of 1 to 5 carbon atoms for the substituent" are each substituted with a halogen atom. Examples of the halogen atom include a fluorine atom, chlorine atom, bromine atom and iodine atom, and a fluorine atom is particularly desirable.

Further, examples of the hydroxyalkyl group for the substituent include groups in which part or all of the hydrogen atoms of an aforementioned "alkyl group of 1 to 5 carbon atoms for the substituent" are each substituted with a hydroxyl group.

In the present invention, it is preferable that a hydrogen atom, an alkyl group of 1 to 5 carbon atoms or a halogenated alkyl group of 1 to 5 carbon atoms is bonded to the carbon atom on the α-position, and of these, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

The term "exposure" is used as a general concept that includes irradiation with any form of radiation.

Effect of the Invention

The present invention is able to provide a resist composition that can suppress pattern collapse and exhibits excellent lithography properties such as pattern shape, LWR, and EL margin, as well as a method of forming a resist pattern that uses the resist composition.

MODE FOR CARRYING OUT THE INVENTION

Resist Composition

The resist composition that represents the first aspect of the present invention includes a base component (A), which exhibits changed solubility in a developing solution under the action of acid and can be used in a lithography process that employs light having a wavelength of 193 nm or less as the exposure light source (hereinafter referred to as "component (A)"), an acid generator component (B) which generates acid upon exposure (hereinafter referred to as "component (B)"), and a polymeric compound (C) having a structural unit (c0) represented by general formula (c0) shown below (hereinafter referred to as "component (C)").

When a resist film that is formed using the resist composition is subjected to selective exposure during resist pattern formation, acid is generated from the component (B), and this acid changes the solubility of the component (A) in a developing solution. As a result, the exposed portions of the resist film exhibit changed solubility in the developing solution, whereas in the unexposed portions, the solubility in the developing solution does not change, meaning subsequent developing of the resist film can be used to form a resist pattern, by dissolving and removing either the exposed portions in the case of a positive-type pattern, or the unexposed portions in the case of a negative-type resist pattern.

The resist composition of the present invention may be a negative-type resist composition or a positive-type resist composition.

In this description, a resist composition used in forming a positive-type resist pattern in which the exposed portions are dissolved and removed is referred to as a "positive-type resist composition", whereas a resist composition used in forming a negative-type resist pattern in which the unexposed portions are dissolved and removed is referred to as a "negative-type resist composition".

<Component (A)>

As the component (A), either a single organic compound or a mixture of two or more organic compounds typically used as the base components for chemically amplified resist compositions used within lithography processes that employ light having a wavelength of 193 nm or less as the exposure light source may be used.

In the present description, the term "base component" refers to an organic compound capable of forming a film, and is preferably an organic compound having a molecular weight of 500 or more. Ensuring that the organic compound has a molecular weight of 500 or more ensures a satisfactory film-forming ability, and facilitates the formation of nano level resist patterns.

The "organic compounds having a molecular weight of 500 or more" that can be used as the base component may be broadly classified into non-polymers and polymers.

In general, compounds which have a molecular weight of at least 500 but less than 4,000 may be used as non-polymers. Hereinafter, the term "low molecular weight compound" is used to describe a non-polymer having a molecular weight of at least 500 but less than 4,000.

In terms of the polymers, typically, compounds which have a molecular weight of 1,000 or more may be used. In the following description, the term "polymeric compound" is used to describe a polymer having a molecular weight of 1,000 or more. In the case of a polymeric compound, the "molecular weight" refers to the weight-average molecular weight in terms of the polystyrene-equivalent value determined by gel permeation chromatography (GPC). Hereinafter, a polymeric compound may be simply referred to as a "resin".

As the component (A), a resin component which exhibits changed solubility in a developing solution under the action of acid may be used, or alternatively, a low molecular weight compound which exhibits changed solubility in a developing solution under the action of acid may be used.

The expression "lithography process that employs light having a wavelength of 193 nm or less as the exposure light source" is not particularly limited, and describes any lithography process that uses a light having a wavelength equal to or shorter than the 193 nm wavelength of an ArF excimer laser as the exposure light source. Specific examples of such exposure light sources include an ArF excimer laser (wavelength: 193 nm), $F_2$ excimer laser (wavelength: 157 nm), extreme ultraviolet radiation (EUV, wavelength: 13.6 nm), vacuum ultraviolet radiation (VUV) and an electron beam (EB). Among these, the base component of the present invention is preferably used with a process that employs an ArF excimer laser, EB or EUV as the exposure light source, and a process that uses an ArF excimer laser as the exposure light source is particularly desirable.

In those cases where the resist composition of the present invention is a "negative-type resist composition for an alkali developing process" which forms a negative-type pattern in an alkali developing process, a base component that is soluble in the alkali developing solution is used as the component (A), and a cross-linking agent is also added to the composition.

In this negative-type resist composition for an alkali developing process, when acid is generated from the component (B) upon exposure, the action of the acid causes cross-linking between the base component and the cross-linking agent, and the cross-linked portions become insoluble in an alkali developing solution. Accordingly, during resist pattern formation, by conducting selective exposure of a resist film formed by applying the negative-type resist composition to a substrate, the exposed portions change to a state that is insoluble in an alkali developing solution, while the unexposed portions remain soluble in an alkali developing solution, meaning alkali developing can be used to form a resist pattern.

Generally, a resin that is soluble in an alkali developing solution (hereinafter, referred to as an "alkali-soluble resin") is used as the component (A) of the negative-type resist composition for an alkali developing process.

Examples of the alkali-soluble resin include a resin having a structural unit derived from at least one of an α-(hydroxyalkyl)acrylic acid and an alkyl ester of α-(hydroxyalkyl) acrylic acid (preferably an alkyl ester having 1 to 5 carbon atoms), as disclosed in Japanese Unexamined Patent Application, First Publication No. 2000-206694; an acrylic resin or polycycloolefin resin having a sulfonamide group, and in which the hydrogen atom bonded to the carbon atom on the α-position may be substituted with a substituent, as disclosed in U.S. Pat. No. 6,949,325; an acrylic resin containing a fluorinated alcohol, and in which the hydrogen atom bonded to the carbon atom on the α-position may be substituted with a substituent, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin having a fluorinated alcohol, as disclosed in Japanese Unexamined Patent Application, First Publication No. 2006-259582. These resins are preferable in that a resist pattern can be formed with minimal swelling.

The term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, usually, an amino-based cross-linking agent such as a glycoluril having a methylol group or alkoxymethyl group, or a melamine-based cross-linking agent is preferable, as it enables formation of a resist pattern with minimal swelling. The amount added of the cross-linking agent is preferably within a range from 1 to 50 parts by weight, relative to 100 parts by weight of the alkali-soluble resin.

In those cases where the resist composition of the present invention is a resist composition which forms a positive-type pattern in an alkali developing process, but forms a negative-type pattern in a solvent developing process, a base component (A0) (hereinafter referred to as "component (A0)") which exhibits increased polarity under the action of acid is preferably used as the component (A). By using the base component (A0), the polarity of the base component changes upon exposure, and therefore favorable developing contrast can be achieved, not only in an alkali developing process, but also in a solvent developing process.

In those cases where an alkali developing process is used, the component (A0) is substantially insoluble in an alkali developing solution prior to exposure, but when acid is generated from the component (B) upon exposure, the action of the acid causes an increase in the polarity of the component (A0) that increases the solubility in the alkali developing solution. Accordingly, during resist pattern formation, by conducting selective exposure of a resist film formed by applying the resist composition to a support, the exposed portions change from being substantially insoluble in the alkali developing solution to being soluble, while the unexposed portions remain substantially insoluble in the alkali developing solution, meaning alkali developing can be used to form a positive-type resist pattern.

Further, in those cases where a solvent developing process is used, the component (A0) exhibits good solubility in an organic developing solution prior to exposure, but when acid is generated from the component (B) upon exposure, the action of the acid causes an increase in the polarity of the component (A0) that reduces the solubility in the organic developing solution. Accordingly, during resist pattern formation, by conducting selective exposure of a resist film formed by applying the resist composition to a support, the exposed portions change from being soluble in the organic developing solution to being substantially insoluble, while the unexposed portions remain soluble in the organic developing solution, meaning developing with the organic developing solution can be used to achieve contrast between the exposed portions and the unexposed portions, enabling formation of a negative-type pattern.

In the resist composition of the present invention, the component (A) is preferably a base component (A0) that exhibits increased polarity under the action of acid. In other words, the resist composition of the present invention is preferably a chemically amplified resist composition that functions as a positive-type composition in an alkali developing process, and functions as a negative-type composition in a solvent developing process.

The component (A0) may be a resin component (A1) that exhibits increased polarity under the action of acid (hereinafter frequently referred to as "component (A1)"), a low molecular weight compound component (A2) that exhibits increased polarity under the action of acid (hereinafter frequently referred to as "component (A2)"), or a mixture thereof

[Component (A1)]

As the component (A1), a single resin component (base resin) typically used as a base component for a chemically amplified resist can be used alone, or two or more of such resin components can be mixed together.

In the present invention, the component (A1) preferably has a structural unit derived from an acrylate ester in which the hydrogen atom bonded to the carbon atom on the α-position may be substituted with a substituent.

In the resist composition of the present invention, the component (A1) preferably includes a structural unit (a1), which is derived from an acrylate ester in which the hydrogen atom bonded to the carbon atom on the α-position may be substituted with a substituent, and contains an acid-degradable group that exhibits increased polarity under the action of acid.

Further, in addition to the structural unit (a1), the component (A1) preferably also includes at least one structural unit (a2) selected from the group consisting of a structural unit which contains an —SO$_2$-containing cyclic group and is derived from an acrylate ester in which the hydrogen atom bonded to the carbon atom on the α-position may be substituted with a substituent, and a structural unit which contains a lactone-containing cyclic group and is derived from an acrylate ester in which the hydrogen atom bonded to the carbon atom on the α-position may be substituted with a substituent.

Furthermore, in addition to either the structural unit (a1) or a combination of the structural units (a1) and (a2), the component (A1) preferably also includes a structural unit (a3), which contains a polar group-containing aliphatic hydrocarbon group and is derived from an acrylate ester in which the hydrogen atom bonded to the carbon atom on the α-position may be substituted with a substituent.

(Structural Unit (a1))

The structural unit (a1) is a structural unit which is derived from an acrylate ester in which the hydrogen atom bonded to the carbon atom on the α-position may be substituted with a substituent, and contains an acid-degradable group that exhibits increased polarity under the action of acid.

The term "acid-degradable group" describes a group having acid degradability which, under the action of the acid generated from the component (B) upon exposure, undergoes cleavage of at least some of the bonds within the structure of the acid-degradable group.

Examples of acid-degradable groups that exhibit increased polarity under the action of acid include groups which degrade under the action of acid to form a polar group.

Examples of this polar group include a carboxyl group, hydroxyl group, amino group and sulfo group (—SO$_3$H). Among these groups, polar groups that contain an —OH within the structure (hereinafter also referred to as "OH-containing polar groups") are preferred, a carboxyl group or a hydroxyl group is more preferable, and a carboxyl group is particularly desirable.

More specific examples of the acid-degradable group include groups in which an aforementioned polar group is protected with an acid-dissociable group (such as a group in which the hydrogen atom of an OH-containing polar group is protected with an acid-dissociable group).

An "acid-dissociable group" describes a group having acid dissociability which, under the action of an acid (such as the acid generated from the component (B) upon exposure), undergoes cleavage of at least the bond between the acid-dissociable group and the atom adjacent to the acid-dissociable group. An acid-dissociable group that constitutes an acid-degradable group must be a group of lower polarity than the polar group generated by dissociation of the acid-dissociable group, so that when the acid-dissociable group dissociates under the action of acid, a polar group having a higher polarity than the acid-dissociable group is generated, resulting in an increase in the polarity. As a result, the polarity of the entire component (A1) increases. Increasing the polarity causes a relative increase in the solubility within the alkali developing solution in the case of an alkali developing process. On the other hand, in the case of a solvent developing process, increasing the polarity causes a relative decrease in the solubility in the organic developing solution containing an organic solvent.

There are no particular limitations on the acid-dissociable group in the structural unit (a1), and any of the groups that have been proposed as acid-dissociable groups within the base resins of chemically amplified resists can be used. Generally, groups that form either a cyclic or chain-like tertiary alkyl ester with the carboxyl group of the (meth)acrylic acid or the like, and acetal-type acid-dissociable groups such as alkoxyalkyl groups are widely known.

Here, a "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group and increasing the polarity of the component (A1).

The chain-like or cyclic alkyl group may have a substituent.

Hereinafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched acid-dissociable groups and aliphatic cyclic group-containing acid-dissociable groups.

In the present description and claims, the term "aliphatic branched" refers to a branched structure having no aromaticity.

The structure of the "aliphatic branched acid-dissociable group" is not limited to groups constituted of only carbon atoms and hydrogen atoms (not limited to hydrocarbon groups), but is preferably a hydrocarbon group.

Further, the "hydrocarbon group" may be either saturated or unsaturated, but in most cases, is preferably saturated.

Examples of the aliphatic branched acid-dissociable groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" excluding substituents is not limited to structures constituted of only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Examples of the aliphatic cyclic group-containing acid-dissociable group include groups having a tertiary carbon atom on the ring structure of a cycloalkyl group. Specific examples include groups represented by general formulas (I-1) to (1-9) shown below, such as a 2-methyl-2-adamantyl group and 2-ethyl-2-adamantyl group.

Further, additional examples of the aliphatic branched acid-dissociable groups include groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, such as the groups represented by general formulas (2-1) to (2-6) shown below.

[Chemical Formula 2]

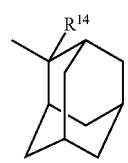

(1-1)

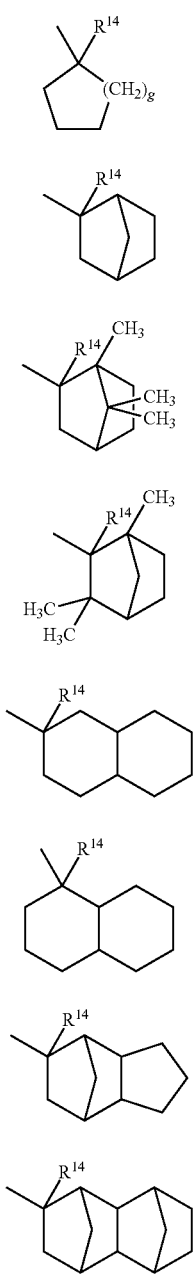

In the formulas above, R$^{14}$ represents an alkyl group, and g represents an integer of 0 to 8

[Chemical Formula 3]

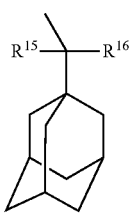

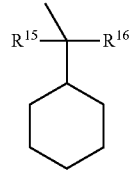

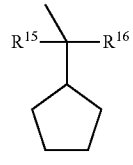

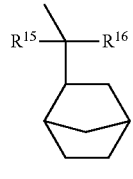

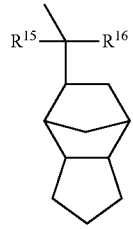

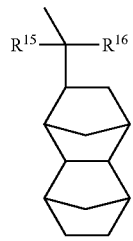

In the formulas above, each of R$^{15}$ and R$^{16}$ independently represents an alkyl group (which may be linear or branched, but preferably contains 1 to 5 carbon atoms).

As the alkyl group for R$^{14}$, a linear or branched alkyl group is preferable.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is particularly desirable.

g is preferably an integer of 0 to 3, more preferably an integer of 1 to 3, and still more preferably 1 or 2.

Examples of the alkyl group for R$^{15}$ and R$^{16}$ include the same alkyl groups as those described above for R$^{14}$.

In formulas (I-1) to (1-9) and (2-1) to (2-6), part of the carbon atoms that constitute the ring(s) may be replaced with an ethereal oxygen atom (—O—).

Further, in formulas (I-1) to (1-9) and (2-1) to (2-6), one or more of the hydrogen atoms bonded to the carbon atoms that constitute the ring(s) may each be substituted with a substituent. Examples of the substituent include an alkyl group of 1 to 5 carbon atoms, a fluorine atom and a fluorinated alkyl group of 1 to 5 carbon atoms.

An "acetal-type acid-dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type acid-dissociable group is bonded, thereby forming an OH-containing polar group such as a carboxyl group or hydroxyl group, and increasing the polarity of the component (A1).

Examples of acetal-type acid-dissociable groups include groups represented by general formula (p1) shown below.

[Chemical Formula 4]

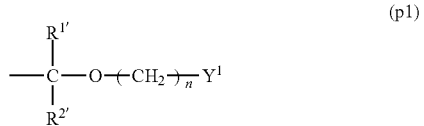

(p1)

In the formula, each of R1' and R2' independently represents a hydrogen atom or an alkyl group of 1 to 5 carbon atoms, n represents an integer of 0 to 3, and $Y^1$ represents an alkyl group of 1 to 5 carbon atoms or an aliphatic cyclic group.

In the above formula, n is preferably an integer of 0 to 2, more preferably 0 or 1, and most preferably 0.

As the alkyl group of 1 to 5 carbon atoms for R1' and R2', the same alkyl groups of 1 to 5 carbon atoms as those described above for R can be used, although a methyl group or ethyl group is preferable, and a methyl group is particularly desirable.

In the present invention, it is preferable that at least one of R1' and R2' is a hydrogen atom. That is, it is preferable that the acid-dissociable group (p1) is a group represented by general formula (p1-1) shown below.

[Chemical Formula 5]

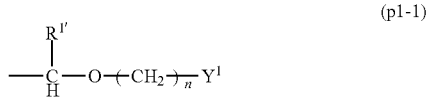

(p1-1)

In the formula, R1', n and $Y^1$ are the same as defined above.

Examples of the alkyl group of 1 to 5 carbon atoms for $Y^1$ include the same alkyl groups of 1 to 5 carbon atoms as those described above for R.

As the aliphatic cyclic group for $Y^1$, any of the monocyclic or polycyclic aliphatic cyclic groups which have been proposed for conventional ArF resists and the like can be appropriately selected for use. For example, the same groups as those described above in connection with the "aliphatic cyclic group" can be used.

Further, as the acetal-type acid-dissociable group, groups represented by general formula (p2) shown below can also be used.

[Chemical Formula 6]

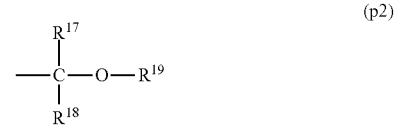

(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein $R^{17}$ and $R^{19}$ are bonded to each other to form a ring.

The alkyl group for $R^{17}$ and $R^{18}$ preferably has 1 to 15 carbon atoms, and may be either linear or branched. As the alkyl group, an ethyl group or methyl group is preferable, and a methyl group is most preferable. It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in the above formula, each of $R^{17}$ and $R^{19}$ may independently represent a linear or branched alkylene group (preferably an alkylene group of 1 to 5 carbon atoms), wherein $R^{19}$ and $R^{17}$ are bonded to each other.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

As the structural unit (a1), it is preferable to use one or more structural units selected from the group consisting of structural units represented by general formula (a1-0-1) shown below and structural units represented by general formula (a1-0-2) shown below.

[Chemical Formula 7]

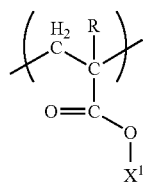

(a1-0-1)

In the formula, R represents a hydrogen atom, an alkyl group of 1 to 5 carbon atoms or a halogenated alkyl group of 1 to 5 carbon atoms, and $X^1$ represents an acid-dissociable group.

[Chemical Formula 8]

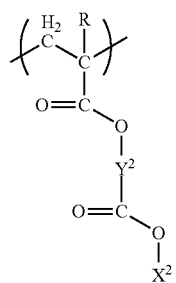

(a1-0-2)

In the formula, R represents a hydrogen atom, an alkyl group of 1 to 5 carbon atoms or a halogenated alkyl group of 1 to 5 carbon atoms, $X^2$ represents an acid-dissociable group, and $Y^2$ represents a divalent linking group.

In general formula (a1-0-1), the alkyl group of 1 to 5 carbon atoms or halogenated alkyl group of 1 to 5 carbon atoms for R are the same as defined above for the alkyl group of 1 to 5 carbon atoms or halogenated alkyl group of 1 to 5 carbon atoms which may be bonded to the carbon atom on the α-position.

$X^1$ is not particularly limited as long as it is an acid-dissociable group. Examples thereof include the aforementioned tertiary alkyl ester-type acid-dissociable groups and acetal-type acid-dissociable groups, and of these, tertiary alkyl ester-type acid-dissociable groups are preferable.

In general formula (a1-0-2), R is the same as defined above.

$X^2$ is the same as defined for $X^1$ in general formula (a1-0-1).

Examples of the divalent linking group for $Y^2$ include alkylene groups, divalent aliphatic cyclic groups, and divalent linking groups containing a hetero atom.

Examples of the aliphatic cyclic group include the same groups as those mentioned above in connection with the description of the "aliphatic cyclic group", with the exception that two or more hydrogen atoms have been removed the group.

When $Y^2$ represents an alkylene group, the group preferably contains 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, a group in which two or more hydrogen atoms have been removed from cyclopentane, cyclohexane, norbornane, isobornane, adamantane, tricyclodecane or tetracyclododecane is particularly desirable.

When $Y^2$ represents a divalent linking group containing a hetero atom, examples thereof include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$—, —S(=O)$_2$—O—, -A-O—B— (wherein 0 is an oxygen atom, and each of A and B independently represents a divalent hydrocarbon group which may have a substituent), and divalent linking groups containing a combination of an alkylene group and a hereto atom.

When $Y^2$ represents —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $Y^2$ is -A-O—B—, each of A and B independently represents a divalent hydrocarbon group which may have a substituent.

The description that the hydrocarbon group "may have a substituent" means that part or all of the hydrogen atoms within the hydrocarbon group may each be substituted with an atom other than a hydrogen atom or with a group.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

More specific examples of the aliphatic hydrocarbon group for A include linear or branched aliphatic hydrocarbon groups, and aliphatic hydrocarbon groups that include a ring within the structure.

The linear or branched aliphatic hydrocarbon group preferably has 1 to 10 carbon atoms, more preferably 1 to 8 carbon atoms, still more preferably 2 to 5 carbon atoms, and most preferably 2 carbon atoms.

As the linear aliphatic hydrocarbon group, a linear alkylene group is preferable, and specific examples include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$) CH$_2$—, —CH(CH$_3$)CH(CH$_3$)—, —C(CH$_3$)$_2$CH$_2$— and —CH(CH$_2$CH$_3$)CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$) CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (which hereinafter may be referred to jointly as a "chain-like aliphatic hydrocarbon group") may or may not have a substituent. Examples of the substituent include a fluorine atom, a fluorinated alkyl group of 1 to 5 carbon atoms and an oxygen atom (=O).

Examples of the aliphatic hydrocarbon group that includes a ring within the structure include cyclic aliphatic hydrocarbon groups (groups in which two hydrogen atoms have been removed from an aliphatic hydrocarbon ring), and groups in which a cyclic aliphatic hydrocarbon group is bonded to the terminal of an aforementioned chain-like aliphatic hydrocarbon group or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

As the group A, a linear aliphatic hydrocarbon group is preferred, a linear alkylene group is more preferred, a linear alkylene group of 2 to 5 carbon atoms is still more preferred, and an ethylene group is the most desirable.

Examples of the hydrocarbon group for B include the same divalent hydrocarbon groups as those listed above for A.

As the group B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 9]

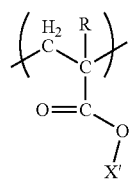

(a1-1)

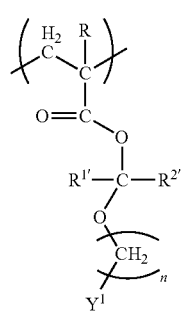

(a1-2)

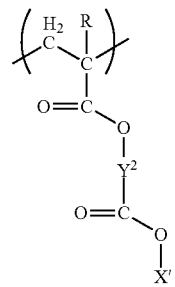

(a1-3)

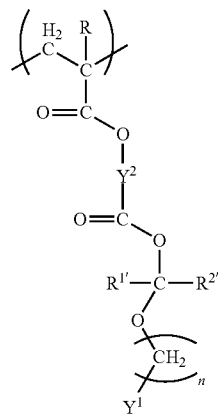

(a1-4)

In the formulas, X' represents a tertiary alkyl ester-type acid-dissociable group, $Y^1$ represents an alkyl group of 1 to 5 carbon atoms or an aliphatic cyclic group, n represents an integer of 0 to 3, $Y^2$ represents a divalent linking group, R is the same as defined above, and each of $R^{1'}$ and $R^{2'}$ independently represents a hydrogen atom or an alkyl group of 1 to 5 carbon atoms.

In the formulas, examples of the tertiary alkyl ester-type acid-dissociable group for X' include the same tertiary alkyl ester-type acid-dissociable groups as those described above for $X^1$.

$R^{1'}$, $R^{2'}$, n and $Y^1$ are the same as defined above for $R^{1'}$, $R^{2'}$, n and $Y^1$ respectively in general formula (p1) described above in connection with the "acetal-type acid-dissociable group".

Examples of $Y^2$ include the same groups as those listed above for $Y^2$ in general formula (a1-0-2).

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 10]

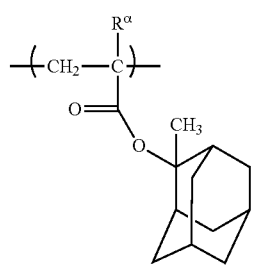

(a1-1-1)

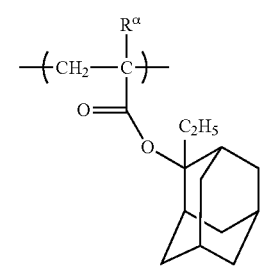
(a1-1-2)
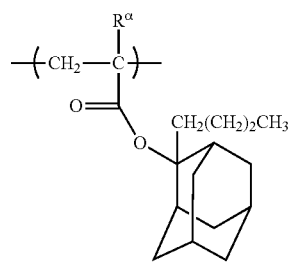
(a1-1-3)
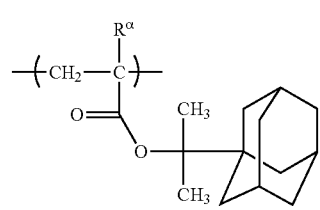
(a1-1-4)
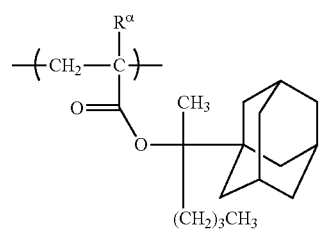
(a1-1-5)
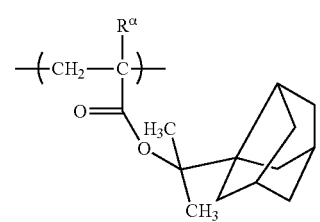
(a1-1-6)
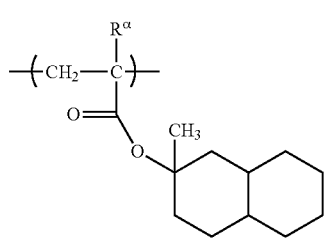
(a1-1-7)
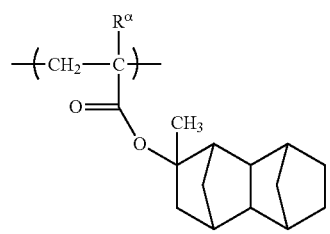
(a1-1-8)
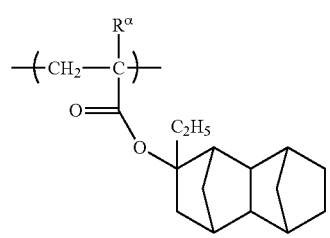
(a1-1-9)
[Chemical Formula 11]
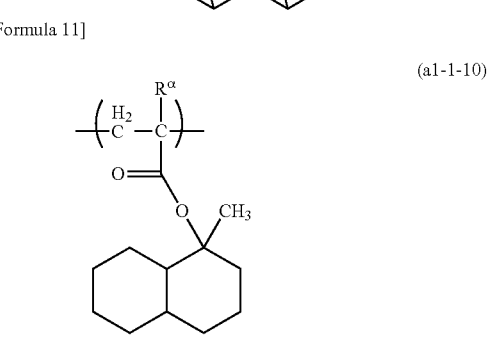
(a1-1-10)
(a1-1-11)
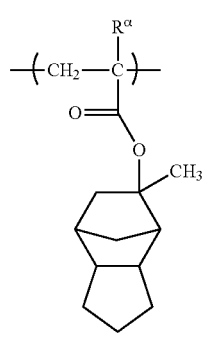
(a1-1-12)
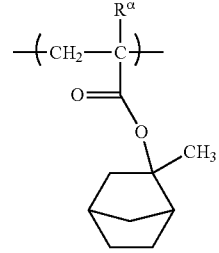
(a1-1-13)
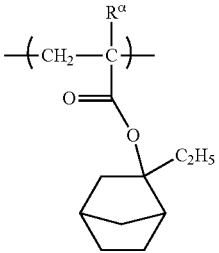

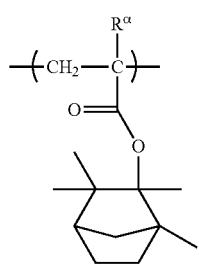
(a1-1-14)
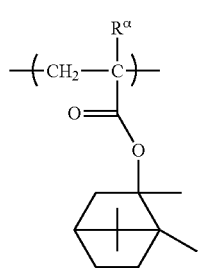
(a1-1-15)
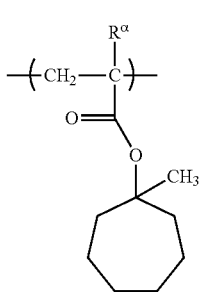
(a1-1-16)
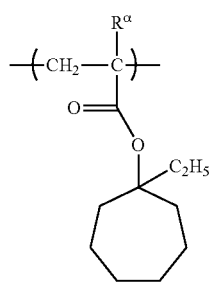
(a1-1-17)
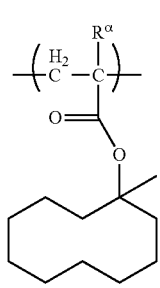
(a1-1-18)
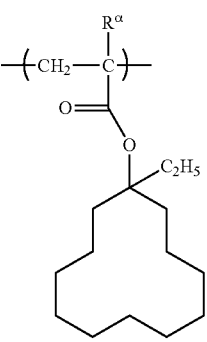
(a1-1-19)
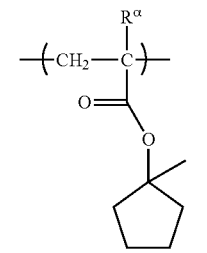
(a1-1-20)
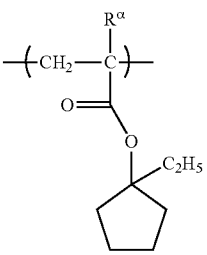
(a1-1-21)
[Chemical Formula 12]
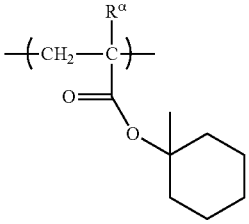
(a1-1-22)
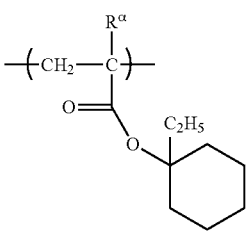
(a1-1-23)
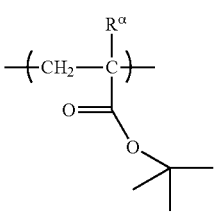
(a1-1-24)

(a1-1-25)
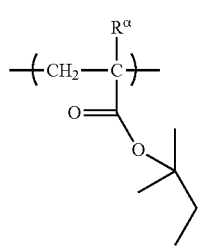
(a1-1-26)
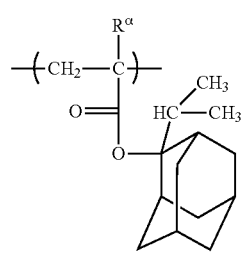
(a1-1-27)
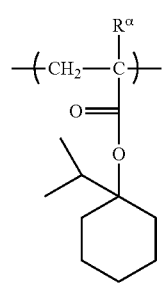
(a1-1-28)
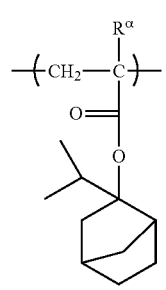
(a1-1-29)
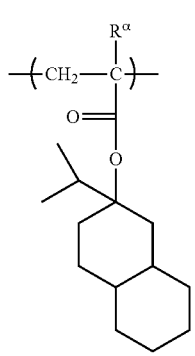
(a1-1-30)
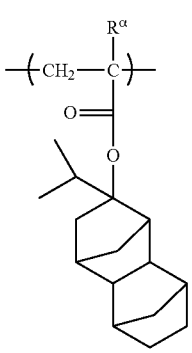
(a1-1-31)
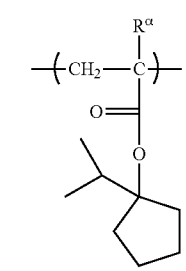
(a1-1-32)
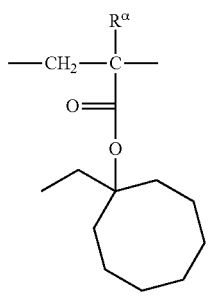
[Chemical Formula 13]
(a1-2-1)
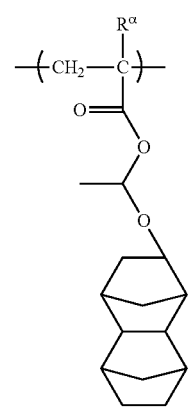

(a1-2-2) 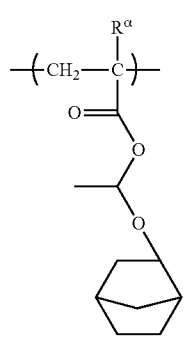
(a1-2-3) 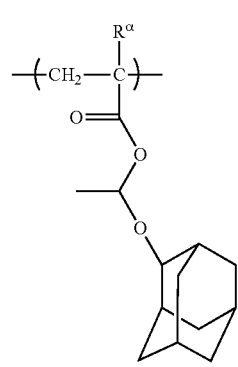
(a1-2-4) 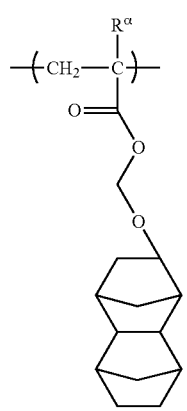
(a1-2-5) 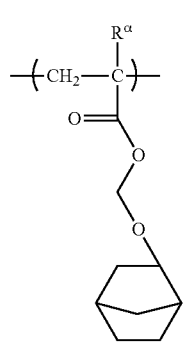
(a1-2-6) 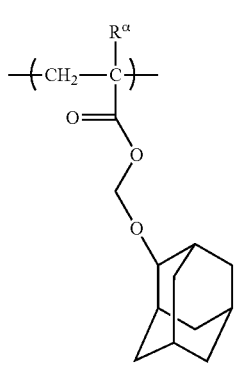
(a1-2-7) 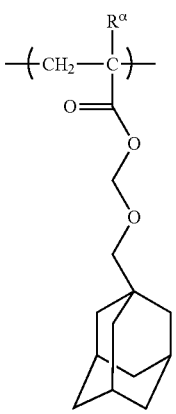
(a1-2-8) 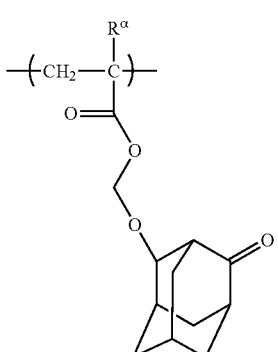
(a1-2-9) 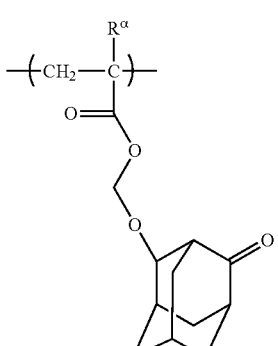

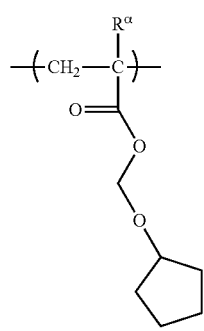
(a1-2-10)
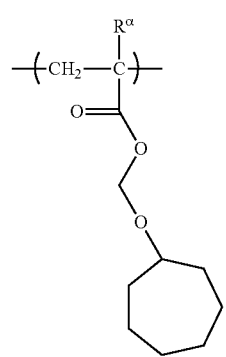
(a1-2-11)
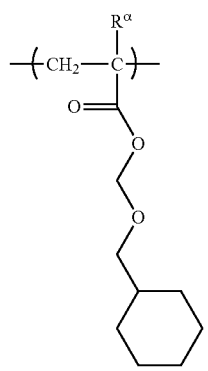
(a1-2-12)
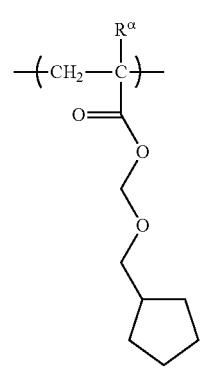
(a1-2-13)
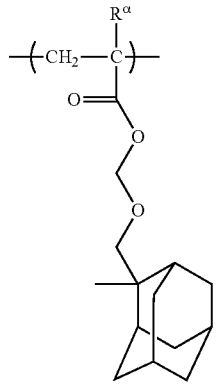
(a1-2-14)
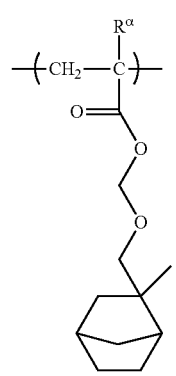
(a1-2-15)
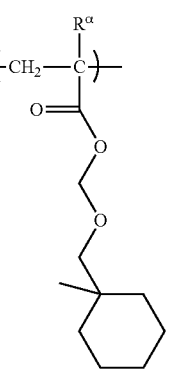
(a1-2-16)
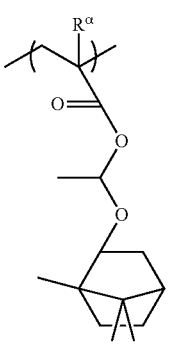
(a1-2-17)

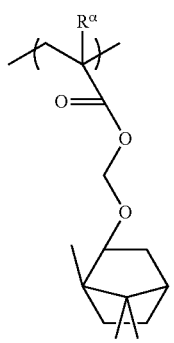
(a1-2-18)
(a1-2-19)
(a1-2-20)
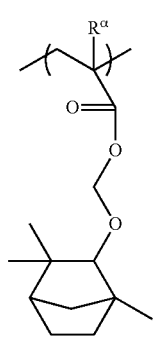
(a1-2-21)
(a1-2-22)
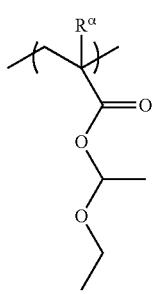
(a1-2-23)
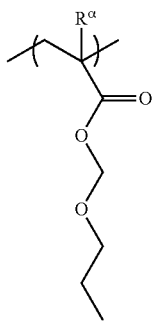
(a1-2-24)
[Chemical Formula 14]
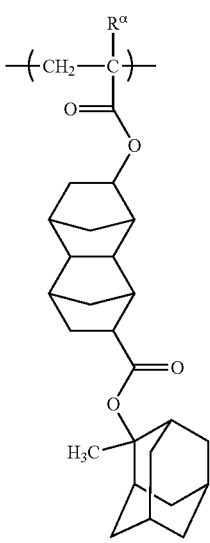
(a1-3-1)

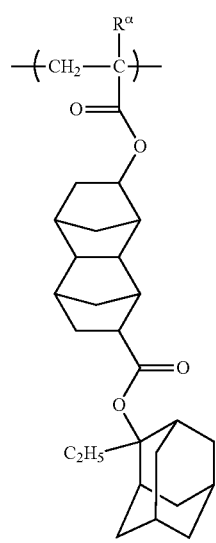
(a1-3-2)
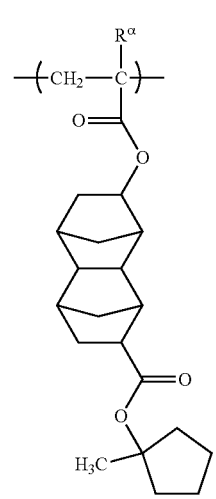
(a1-3-3)
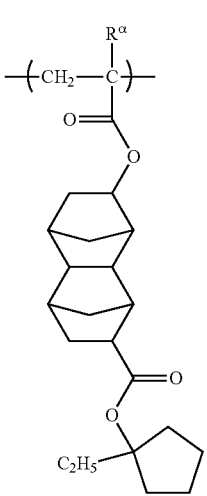
(a1-3-4)
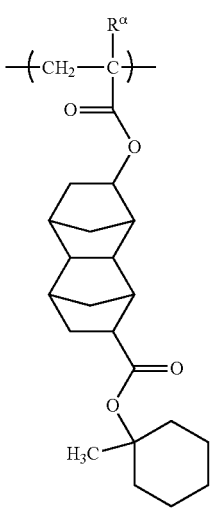
(a1-3-5)
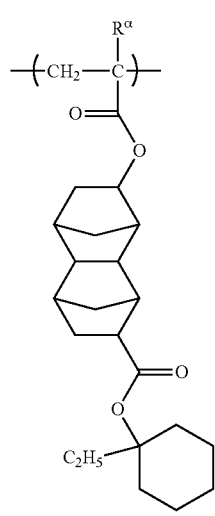
(a1-3-6)
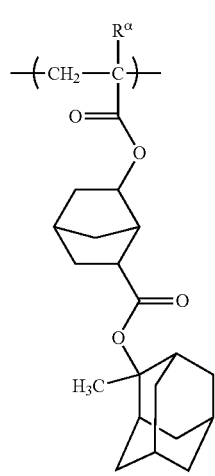
(a1-3-7)

(a1-3-8)
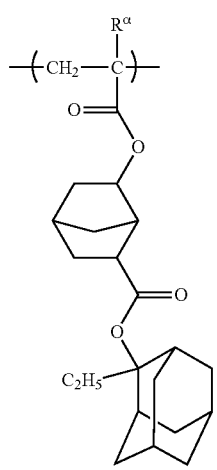
(a1-3-9)
(a1-3-10)
(a1-3-11)
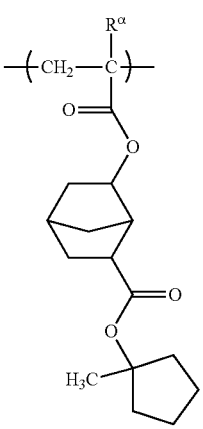
(a1-3-12)
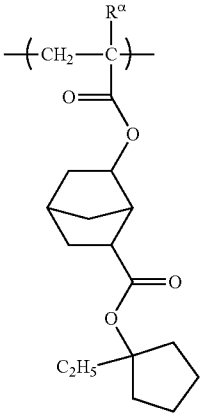
(a1-3-13)
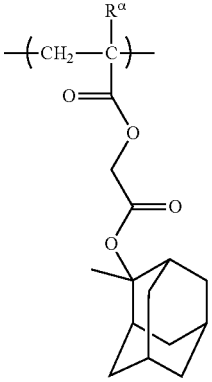
(a1-3-14)
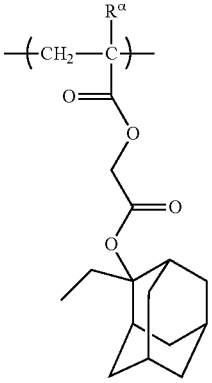

(a1-3-15)
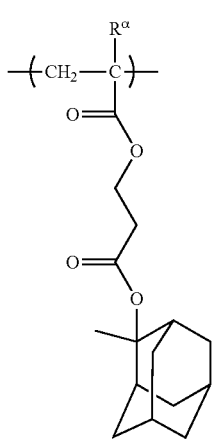
(a1-3-16)
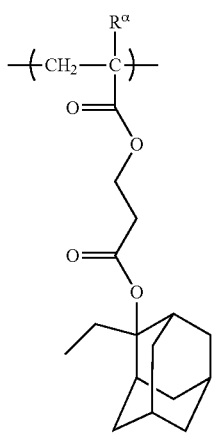
(a1-3-17)
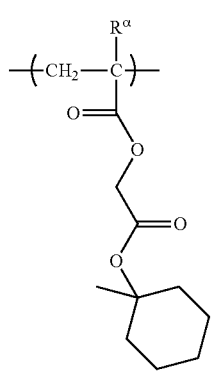
(a1-3-18)
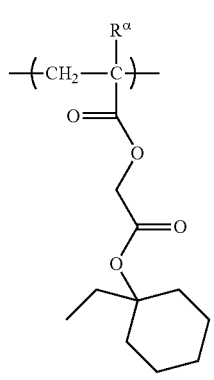
[Chemical Formula 15]
(a1-3-19)
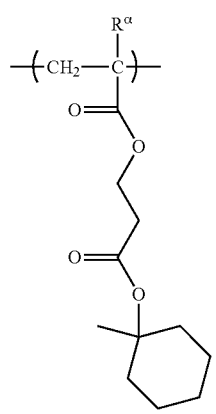
(a1-3-20)
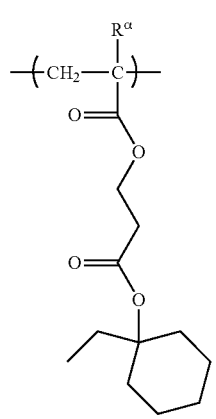
(a1-3-21)
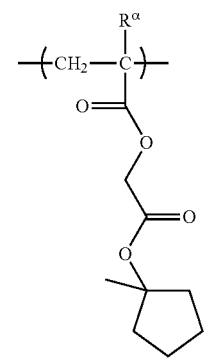
(a1-3-22)
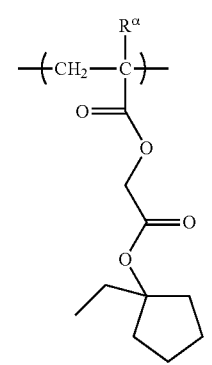

(a1-3-23)
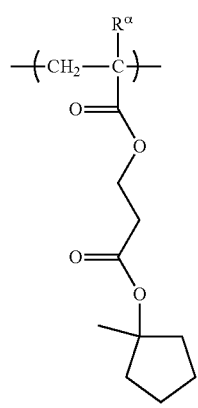
(a1-3-24)
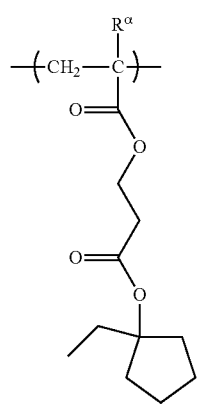
[Chemical Formula 16]
(a1-3-25)
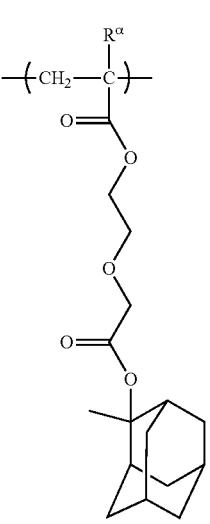
(a1-3-26)
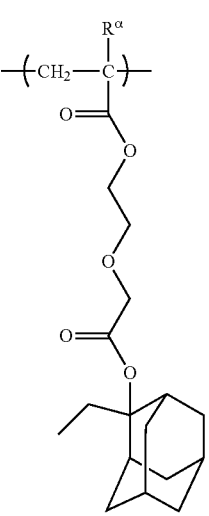
(a1-3-27)
(a1-3-28)
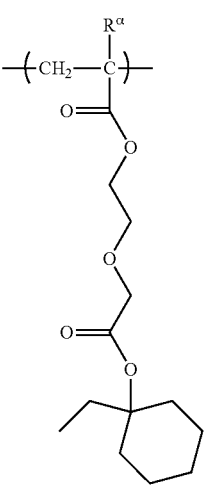

(a1-3-29)
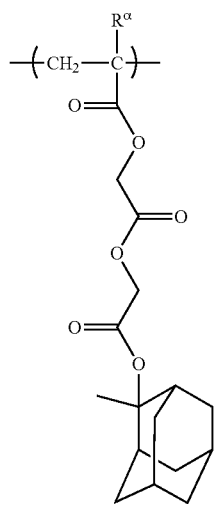
(a1-3-30)
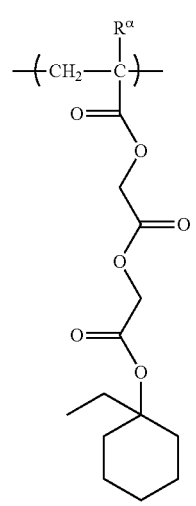
(a1-3-31)
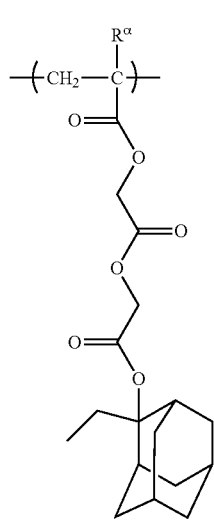
(a1-3-32)
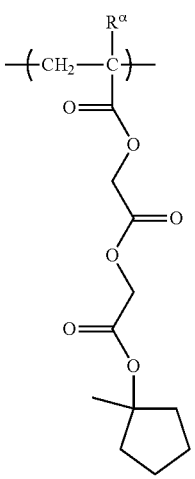
[Chemical Formula 17]
(a1-4-1)
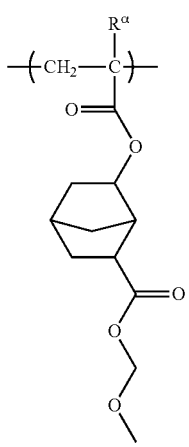
(a1-4-2)
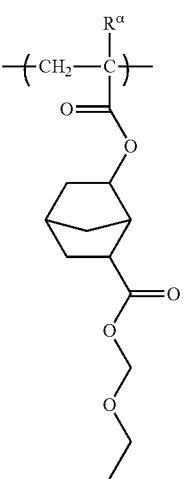

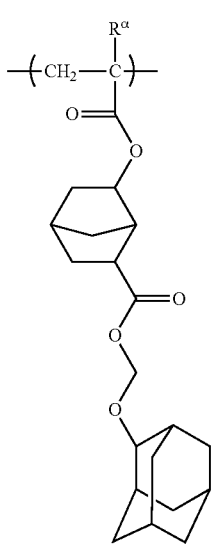
(a1-4-3)
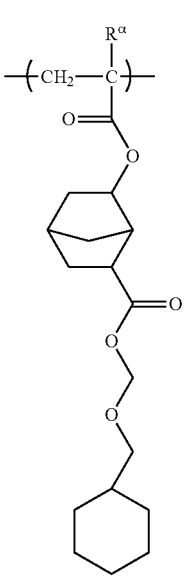
(a1-4-6)
(a1-4-4)
(a1-4-7)
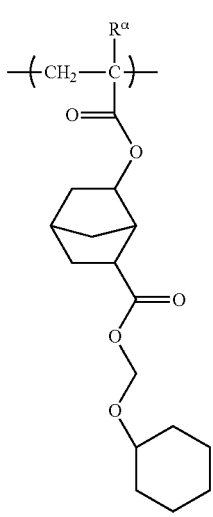
(a1-4-5)
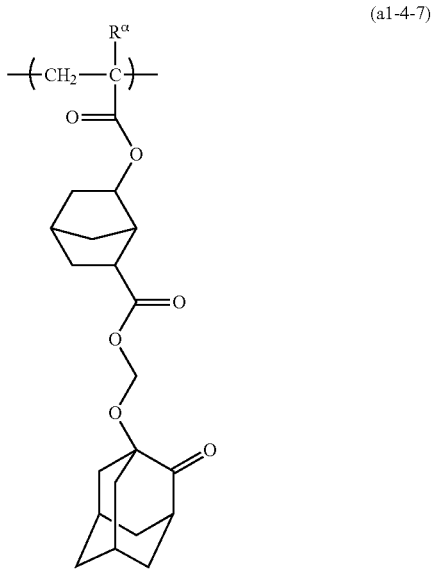
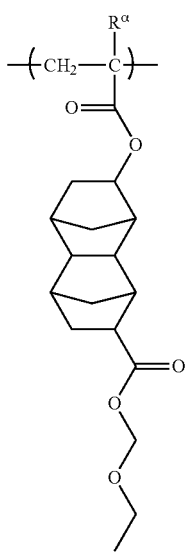
(a1-4-8)

(a1-4-9)
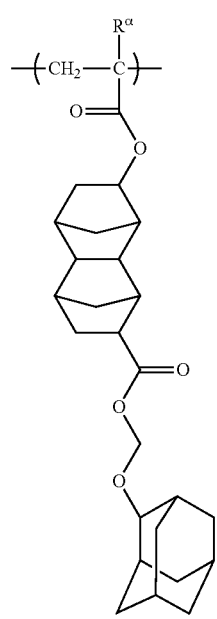
(a1-4-11)
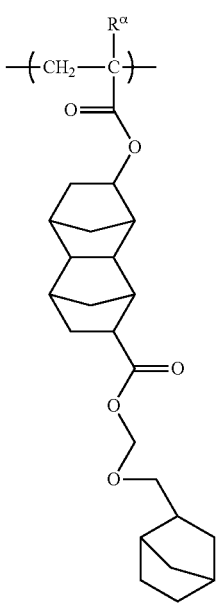
(a1-4-10)
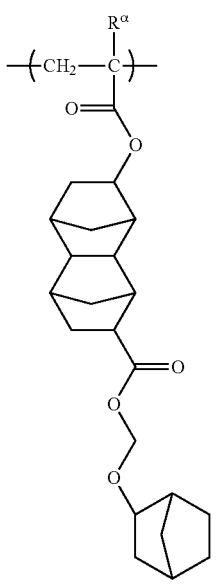
(a1-4-12)
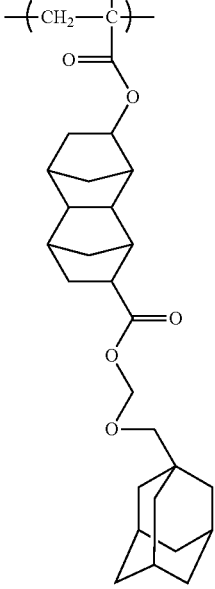

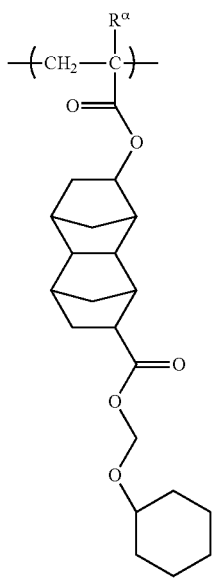

(a1-4-13)

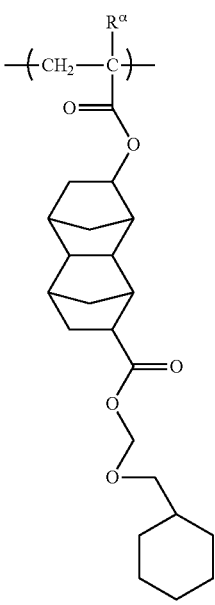

(a1-4-14)

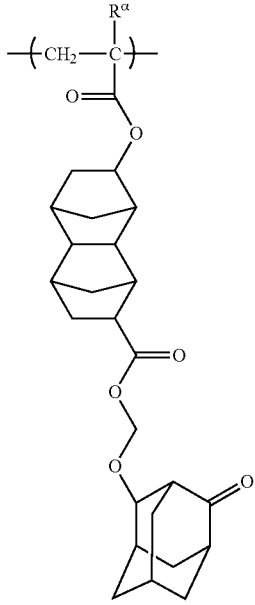

(a1-4-15)

As the structural unit (a1), one type of structural unit may be used alone, or two or more types of structural units may be used in combination.

Among these, structural units represented by general formula (a1-1), (a1-2) or (a1-3) are preferable. More specifically, at least one structural unit selected from the group consisting of structural units represented by formulas (a1-1-1) to (a-1-1-4), (a1-1-20) to (a1-1-23), (a1-2-1) to (a1-2-24) and (a1-3-25) to (a1-3-28) is more preferable.

Further, as the structural unit (a1), structural units represented by general formula (a1-1-01) shown below which includes the structural units represented by formulas (a1-1-1) to (a1-1-3) and (a1-1-26), structural units represented by general formula (a1-1-02) shown below which includes the structural units represented by formulas (a1-1-16), (a1-1-17), (a1-1-20) to (a1-1-23) and (a1-1-32), structural units represented by general formula (a1-3-01) shown below which includes the structural units represented by formulas (a1-3-25) and (a1-3-26), structural units represented by general formula (a1-3-02) shown below which includes the structural units represented by formulas (a1-3-27) and (a1-3-28), and structural units represented by general formula (a1-3-03) shown below which includes the structural units represented by formulas (a1-3-29) and (a1-3-30) are also preferable.

[Chemical Formula 18]

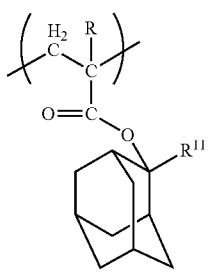

(a1-1-01)

-continued (a1-1-02)

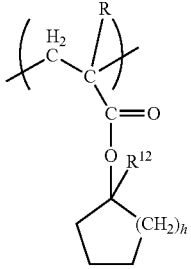

In the formulas, each R independently represents a hydrogen atom, an alkyl group of 1 to 5 carbon atoms or a halogenated alkyl group of 1 to 5 carbon atoms, $R^{11}$ represents an alkyl group of 1 to 5 carbon atoms, $R^{12}$ represents an alkyl group of 1 to 7 carbon atoms, and h represents an integer of 1 to 6.

In general formula (a1-1-01), R is the same as defined above. The alkyl group of 1 to 5 carbon atoms for $R^{11}$ is the same as defined above for the alkyl group of 1 to 5 carbon atoms for R, and a methyl group, ethyl group or isopropyl group is preferable.

In general formula (a1-1-02), R is the same as defined above. The alkyl group of 1 to 5 carbon atoms for $R^{12}$ is the same as defined above for the alkyl group of 1 to 5 carbon atoms for R, and a methyl group, ethyl group or isopropyl group is preferable. h is preferably 1 or 2, and most preferably 2.

[Chemical Formula 19]

(a1-3-01)

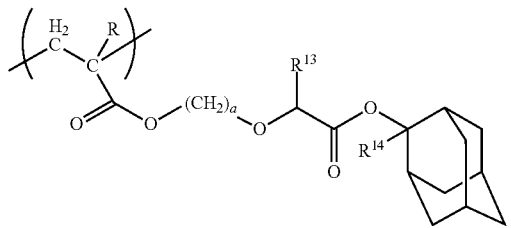

In the formula, R represents a hydrogen atom, an alkyl group of 1 to 5 carbon atoms or a halogenated alkyl group of 1 to 5 carbon atoms, $R^{14}$ is the same as defined above, $R^{13}$ represents a hydrogen atom or a methyl group, and a represents an integer of 1 to 10.

[Chemical Formula 20]

(a1-3-02)

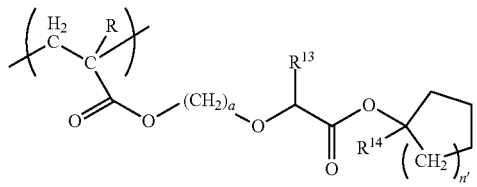

In the formula, R represents a hydrogen atom, an alkyl group of 1 to 5 carbon atoms or a halogenated alkyl group of 1 to 5 carbon atoms, $R^{14}$ is the same as defined above, $R^{13}$ represents a hydrogen atom or a methyl group, a represents an integer of 1 to 10, and n' represents an integer of 1 to 6.

[Chemical Formula 21]

(a1-3-03)

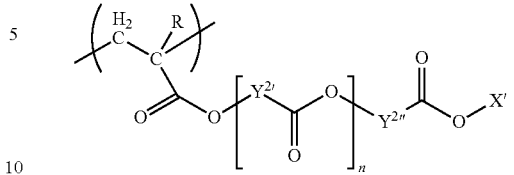

In the formula, R is the same as defined above, each of $Y^{2'}$ and $Y^{2''}$ independently represents a divalent linking group, X' represents an acid-dissociable group, and n represents an integer of 0 to 3.

In general formulas (a1-3-01) to (a1-3-03), R is the same as defined above.

$R^{13}$ is preferably a hydrogen atom.

n' is preferably 1 or 2, and is most preferably 2.

a is preferably an integer of 1 to 8, more preferably an integer of 2 to 5, and most preferably 2.

Examples of the divalent linking groups for $Y^{2'}$ and $Y^{2''}$ include the same groups as those described above for $Y^2$ in general formula (a1-3).

As the group $Y^{2'}$, a divalent hydrocarbon group which may have a substituent is preferable, a linear aliphatic hydrocarbon group is more preferable, and a linear alkylene group is still more preferable. Among such linear alkylene groups, a linear alkylene group of 1 to 5 carbon atoms is preferable, and a methylene group or an ethylene group is particularly desirable.

As the group $Y^{2''}$, a divalent hydrocarbon group which may have a substituent is preferable, a linear aliphatic hydrocarbon group is more preferable, and a linear alkylene group is still more preferable. Among such linear alkylene groups, a linear alkylene group of 1 to 5 carbon atoms is preferable, and a methylene group or an ethylene group is particularly desirable.

Examples of the acid-dissociable group for X' include the same groups as those described above. X' is preferably a tertiary alkyl ester-type acid-dissociable group, and more preferably an aforementioned group which has a tertiary carbon atom on the ring structure of a monovalent aliphatic cyclic group. Among such groups, a group represented by general formula (1-1) above is preferable.

n represents an integer of 0 to 3, preferably an integer of 0 to 2, more preferably 0 or 1, and most preferably 1.

In the component (A1), the amount of the structural unit (a1), based on the combined total of all the structural units that constitute the component (A1), is preferably within a range from 5 to 90 mol %, more preferably from 10 to 85 mol %, and still more preferably 15 to 80 mol %. When the amount of the structural unit (a1) is at least as large as the lower limit of the above range, a pattern can be formed easily using a resist composition prepared from the component (A1). On the other hand, when the amount of the structural unit (a1) is not more than the upper limit of the above range, a good balance can be achieved with the other structural units.

(Structural Unit (a2))

The structural unit (a2) is at least one structural unit selected from the group consisting of a structural unit which contains an —$SO_2$-containing cyclic group and is derived from an acrylate ester in which the hydrogen atom bonded to the carbon atom on the α-position may be substituted with a substituent (hereinafter referred to as "structural unit (a2$^S$)"), and a structural unit which contains a lactone-containing cyclic group and is derived from an acrylate ester in which the hydrogen atom bonded to the carbon atom on the α-position may be substituted with a substituent (hereinafter referred to as "structural unit (a2$^L$)").

By incorporating an —SO$_2$-containing cyclic group or a lactone-containing cyclic group, the structural unit (a2) contributes to improvements in the lithography properties, including improving the adhesion between the substrate and a resist film formed using a resist composition containing the component (A1), and increasing the compatibility with developing solutions containing water (particularly in the case of an alkali developing process).

Structural Unit (a2$^S$)

The structural unit (a2$^S$) is a structural unit which contains an —SO$_2$-containing cyclic group and is derived from an acrylate ester in which the hydrogen atom bonded to the carbon atom on the α-position may be substituted with a substituent In this description, the term "—SO$_2$-containing cyclic group" refers to a cyclic group which includes a ring containing an —SO$_2$— moiety within the ring structure, and specifically refers to cyclic groups in which the sulfur atom (S) of the —SO$_2$— forms a part of the ring structure of the cyclic group. The ring containing the —SO$_2$— moiety within the ring structure is counted as the first ring, and groups containing only the first ring are referred to as monocyclic groups, whereas groups containing other ring structures are described as polycyclic groups regardless of the structure of the other rings. The —SO$_2$-containing cyclic group may be either monocyclic or polycyclic.

The —SO$_2$-containing cyclic group is preferably a cyclic group containing an —O—SO$_2$-moiety within the ring structure, namely a cyclic group containing a sultone ring in which the —O—S— within the —O—SO$_2$— forms a part of the ring structure.

The —SO$_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —SO$_2$-containing cyclic group may be an —SO$_2$-containing aliphatic cyclic group or an —SO$_2$-containing aromatic cyclic group. An —SO$_2$-containing aliphatic cyclic group is preferred.

Examples of the —SO$_2$-containing aliphatic cyclic group include groups in which at least one hydrogen atom has been removed from an aliphatic hydrocarbon ring in which part of the carbon atoms that constitute the ring structure have been substituted with either —SO$_2$— or —O—SO$_2$—. More specific examples include groups in which at least one hydrogen atom has been removed from an aliphatic hydrocarbon ring in which a —CH$_2$— moiety that constitutes part of the ring structure has been substituted with an —SO$_2$— moiety, and groups in which at least one hydrogen atom has been removed from an aliphatic hydrocarbon ring in which a —CH$_2$—CH$_2$— moiety that constitutes part of the ring structure has been substituted with an —O—SO$_2$— moiety.

The alicyclic hydrocarbon group preferably contains 3 to 20 carbon atoms, and more preferably 3 to 12 carbon atoms.

The alicyclic hydrocarbon group may be either polycyclic or monocyclic. As the monocyclic alicyclic hydrocarbon group, groups in which two hydrogen atoms have been removed from a monocycloalkane of 3 to 6 carbon atoms are preferable, and specific examples of such monocycloalkanes include cyclopentane and cyclohexane. As the polycyclic alicyclic hydrocarbon group, groups in which two hydrogen atoms have been removed from a polycycloalkane of 7 to 12 carbon atoms are preferable, and specific examples of such polycycloalkanes include adamantane, norbornane, isobornane, tricyclodecane and tetracyclododecane.

The —SO$_2$-containing cyclic group may have a substituent. Examples of the substituent include an alkyl group, alkoxy group, halogen atom, halogenated alkyl group, hydroxyl group, oxygen atom (=O), —COOR", —OC(=O)R", hydroxyalkyl group and cyano group.

The alkyl group for the substituent is preferably an alkyl group of 1 to 6 carbon atoms. The alkyl group is preferably a linear or branched group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferred, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the alkyl groups described above as the substituent.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group substituent have each been substituted with an aforementioned halogen atom. A fluorinated alkyl group is preferred as the halogenated alkyl group, and a perfluoroalkyl group is particularly desirable.

In the aforementioned —COOR" group and —OC(=O)R" group, R" represents a hydrogen atom, or a linear, branched or cyclic alkyl group of 1 to 15 carbon atoms.

In those cases where R" represents a linear or branched alkyl group, the alkyl group preferably contains 1 to 10 carbon atoms, and more preferably 1 to 5 carbon atoms, and is most preferably a methyl group or ethyl group.

In those cases where R" is a cyclic alkyl group, the cycloalkyl group preferably contains 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably contains 1 to 6 carbon atoms, and specific examples include groups in which at least one hydrogen atom within an aforementioned alkyl group for the substituent has been substituted with a hydroxyl group.

More specific examples of the —SO$_2$-containing cyclic group include groups represented by general formulas (3-1) to (3-4) shown below.

[Chemical Formula 22]

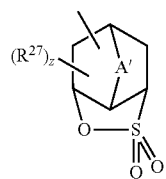 (3-1)

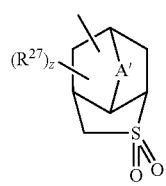 (3-2)

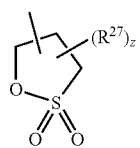 (3-3)

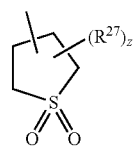 (3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^{27}$ represents an alkyl group, alkoxy group, halogenated alkyl group, hydroxyl group, —COOR", —OC(=O)R", hydroxyalkyl group or cyano group, wherein R" represents a hydrogen atom or an alkyl group.

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms for A', a linear or branched alkylene group is preferable, and specific examples include a methylene group, ethylene group, n-propylene group and isopropylene group.

Examples of the alkylene groups which contain an oxygen atom or a sulfur atom include the aforementioned alkylene groups in which —O— or —S— is either bonded to the terminal of the alkylene group or interposed within the alkylene group. Specific examples of such alkylene groups include —O—CH$_2$—, —CH$_2$—O—CH$_2$—, —S—CH$_2$— and —CH$_2$—S—CH$_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^{27}$ groups may be the same or different from each other.

Examples of the alkyl group, alkoxy group, halogenated alkyl group, —COOR" group, —OC(=O)R" group and hydroxyalkyl group for $R^{27}$ include the same alkyl groups, alkoxy groups, halogenated alkyl groups, —COOR" groups, —OC(=O)R" groups and hydroxyalkyl groups as those described above for the substituent which the —SO$_2$-containing cyclic group may have.

Specific examples of the cyclic groups represented by general formulas (3-1) to (3-4) are shown below. In the formulas shown below, "Ac" represents an acetyl group.

[Chemical Formula 23]

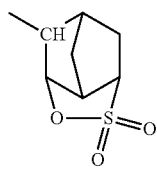 (3-1-1)

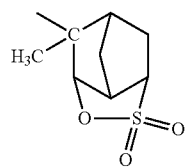 (3-1-2)

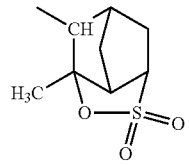 (3-1-3)

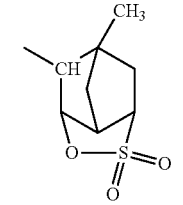 (3-1-4)

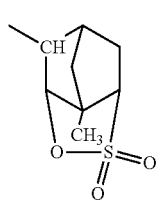 (3-1-5)

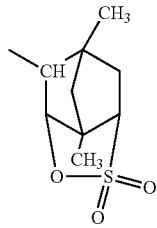 (3-1-6)

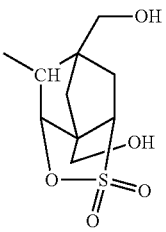 (3-1-7)

-continued
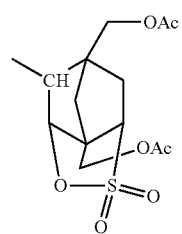 (3-1-8)
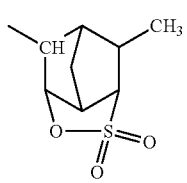 (3-1-9)
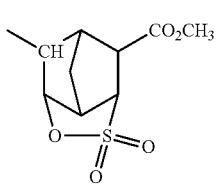 (3-1-10)
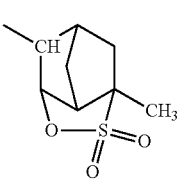 (3-1-11)
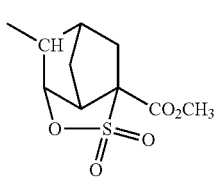 (3-1-12)
[Chemical Formula 24]
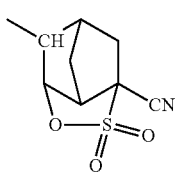 (3-1-13)
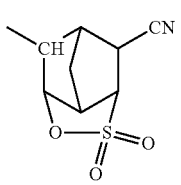 (3-1-14)
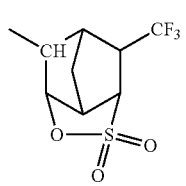 (3-1-15)
-continued
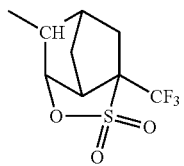 (3-1-16)
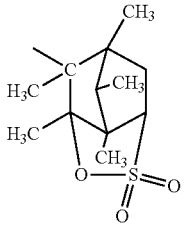 (3-1-17)
[Chemical Formula 25]
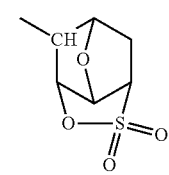 (3-1-18)
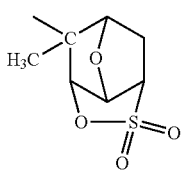 (3-1-19)
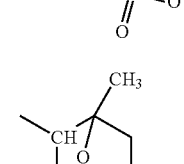 (3-1-20)
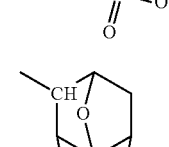 (3-1-21)
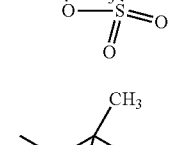 (3-1-22)
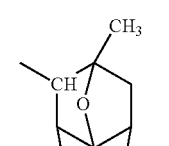 (3-1-23)

-continued (3-1-24)
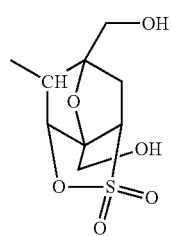

(3-1-25)
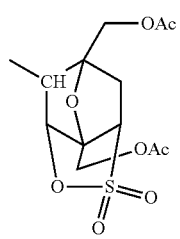

[Chemical Formula 26]

(3-1-26)
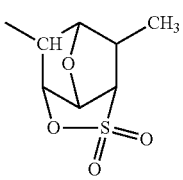

(3-1-27)
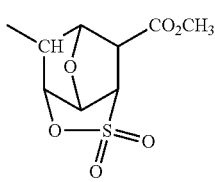

(3-1-28)
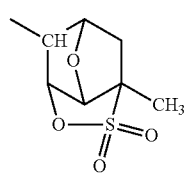

(3-1-29)
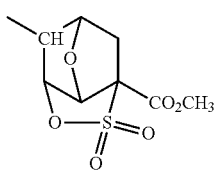

(3-1-30)
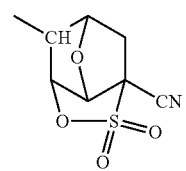

(3-1-31)
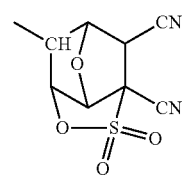

(3-1-32)
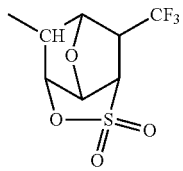

(3-1-33)
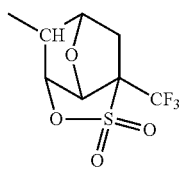

[Chemical Formula 27]

(3-2-1)
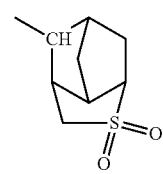

(3-2-2)
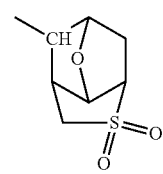

(3-3-1)
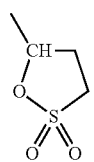

(3-4-1)
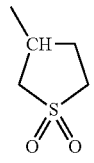

Of the groups shown above, the —SO$_2$-containing cyclic group is preferably a group represented by general formula (3-1), more preferably at least one group selected from the group consisting of groups represented by the above chemical formulas (3-1-1), (3-1-18), (3-3-1) and (3-4-1), and most preferably a group represented by chemical formula (3-1-1).

More specific examples of the structural unit (a2$^S$) include structural units represented by general formula (a2-0) shown below (a2-0)
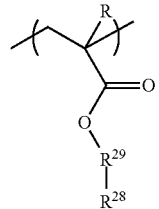

In the formula, R represents a hydrogen atom, an alkyl group of 1 to 5 carbon atoms or a halogenated alkyl group of 1 to 5 carbon atoms, $R^{28}$ represents an —$SO_2$-containing cyclic group, and $R^{29}$ represents a single bond or a divalent linking group.

In the formula (a2-0), R is the same as defined above.

$R^{28}$ is the same as the —$SO_2$-containing cyclic group described above.

$R^{29}$ may be either a single bond or a divalent linking group. A divalent linking group is preferable in terms of achieving superior effects for the present invention.

There are no particular limitations on the divalent linking group for $R^{29}$, and examples include the same divalent linking groups as those described above for $Y^2$. Among these groups, an alkylene group or a group containing an ester linkage (—C(=O)—O—) is preferred.

The alkylene group is preferably a linear or branched alkylene group. Specific examples include the same groups as the linear alkylene groups and branched alkylene groups described above as the aliphatic hydrocarbon group for $Y^2$.

As the divalent linking group containing an ester linkage, groups represented by general formula: —$R^{30}$—C(=O)—O— (wherein $R^{30}$ represents the divalent linking group) are preferred. In other words, the structural unit ($a2^S$) is preferably a structural unit represented by general formula (a2-0-1) shown below.

[Chemical Formula 29]

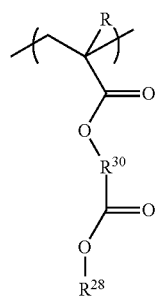

(a2-0-1)

In the formula, R and $R^{28}$ are each the same as defined above, and $R^{30}$ is a divalent linking group.

There are no particular limitations on $R^{30}$, and examples include the same groups as the divalent linking groups described above for $Y^2$.

As the divalent linking group for $R^{30}$, a linear or branched alkylene group, a divalent alicyclic hydrocarbon group, or a divalent linking group containing a hetero atom is preferred.

Examples of the linear or branched alkylene group, divalent alicyclic hydrocarbon group, and divalent linking group containing a hetero atom include the same linear or branched alkylene groups, divalent alicyclic hydrocarbon groups, and divalent linking groups containing a hetero atom as those described above as preferred groups for $Y^2$.

Of the above groups, a linear or branched alkylene group, or a divalent linking group containing an oxygen atom as a hetero atom is preferred.

As the linear alkylene group, a methylene group or ethylene group is preferred, and a methylene group is particularly desirable.

As the branched alkylene group, an alkylmethylene group or alkylethylene group is preferred, and —CH(CH$_3$)—, —C(CH$_3$)$_2$— and —C(CH$_3$)$_2$CH$_2$— are particularly desirable.

The divalent linking group containing an oxygen atom is preferably a divalent linking group containing an ether linkage or an ester linkage, and is more preferably a group represented by a formula -A-O—B—, [A-C(=O)—O]$_m$—B— or -A-O—C(=O)—B—.

Among these, groups represented by -A-O—C(=O)—B— are preferred, and groups represented by —(CH$_2$)$_c$—C(=O)—O—(CH$_2$)$_d$— are particularly desirable. c represents an integer of 1 to 5, and is preferably 1 or 2. d represents an integer of 1 to 5, and is preferably 1 or 2.

As the structural unit ($a2^S$), structural units represented by general formula (a2-1-11) or (a2-1-12) shown below are preferred, and structural units represented by formula (a2-1-12) are particularly desirable.

[Chemical Formula 30]

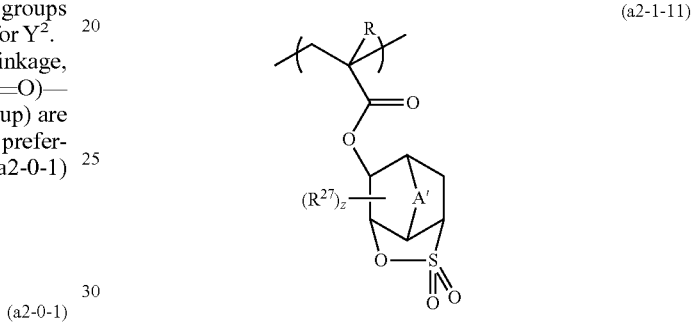

(a2-1-11)

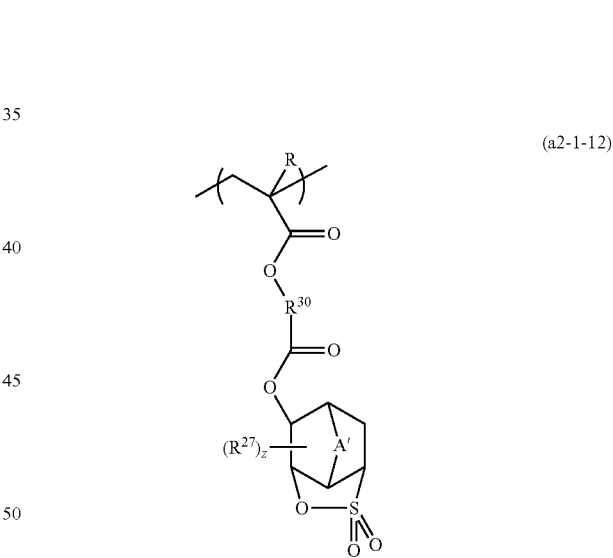

(a2-1-12)

In the formulas, R, A', $R^{27}$, z and $R^{30}$ are each the same as defined above.

In formula (a2-1-11), A' is preferably a methylene group, an oxygen atom (—O—) or a sulfur atom (—S—).

$R^{30}$ is preferably a linear or branched alkylene group, or a divalent linking group containing an oxygen atom. Examples of the linear or branched alkylene group, and the divalent linking group containing an oxygen atom for $R^{30}$ include the same linear or branched alkylene groups, and divalent linking groups containing an oxygen atom described above.

As the structural unit represented by formula (a2-1-12), a structural unit represented by general formula (a2-1-12a) or (a2-1-12b) shown below is particularly desirable.

[Chemical Formula 31]

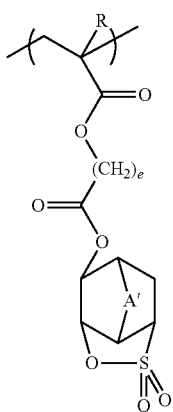
(a2-1-12a)

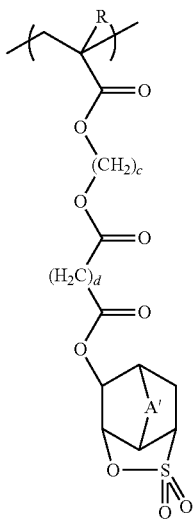
(a2-1-12b)

In the formulas, R and A' are each the same as defined above, and each of c to e independently represents an integer of 1 to 3.

Structural Unit (a2$^L$)

The structural unit (a2$^L$) is a structural unit which contains a lactone-containing cyclic group and is derived from an acrylate ester in which the hydrogen atom bonded to the carbon atom on the α-position may be substituted with a substituent.

In this description, the term "lactone-containing cyclic group" refers to a cyclic group including a ring (lactone ring) containing an —O—C(O)— moiety within the ring structure. The lactone ring is counted as the first ring, and a lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

There are no particular limitations on the lactone-containing cyclic group within the structural unit (a2$^L$), and an arbitrary lactone-containing cyclic group may be used. Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Examples of the structural unit (a2$^L$) include structural units of the above general formula (a2-0) in which R$^{28}$ has been substituted with a lactone-containing cyclic group, and more specific examples include structural units represented by general formulas (a2-1) to (a2-5) shown below.

[Chemical Formula 32]

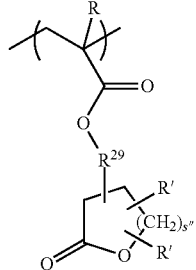
(a2-1)

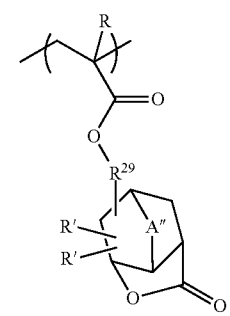
(a2-2)

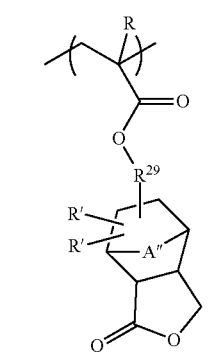
(a2-3)

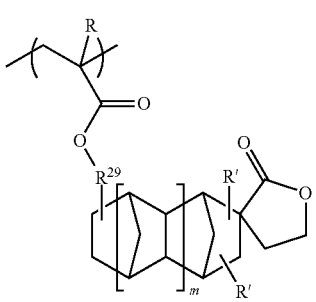
(a2-4)

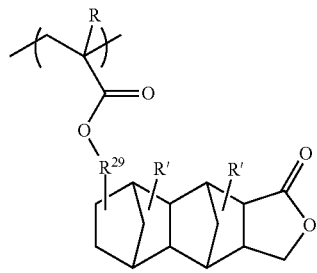
(a2-5)

In the formulas, R represents a hydrogen atom, an alkyl group of 1 to 5 carbon atoms or a halogenated alkyl group of 1 to 5 carbon atoms, each R' independently represents a hydrogen atom, an alkyl group of 1 to 5 carbon atoms, an alkoxy group of 1 to 5 carbon atoms or —COOR", wherein R" represents a hydrogen atom or an alkyl group, $R^{29}$ represents a single bond or a divalent linking group, s" represents an integer of 0 to 2, A" represents an oxygen atom, a sulfur atom or an alkylene group of 1 to 5 carbon atoms which may contain an oxygen atom or a sulfur atom, and m represents 0 or 1.

In general formulas (a2-1) to (a2-5), R is the same as defined above for R in the structural unit (a1).

Examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

In terms of factors such as industrial availability, R' is preferably a hydrogen atom.

The alkyl group for R" may be a linear, branched or cyclic alkyl group.

When R" is a linear or branched alkyl group, the alkyl group preferably contains 1 to 10 carbon atoms, and more preferably 1 to 5 carbon atoms When R" is a cyclic alkyl group, the cycloalkyl group preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Examples of A" include the same groups as those described above for A' in general formula (3-1). A" is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or dimethylmethylene group is preferable, and a methylene group is the most desirable.

$R^{29}$ is the same as defined above for $R^{29}$ in general formula (a2-0).

In formula (a2-1), s" is preferably 1 or 2.

Specific examples of the structural units represented by general formulas (a2-1) to (a2-5) are shown below. In each of the following formulas, $R^{\alpha}$ represents a hydrogen atom, a methyl group or a trifluoromethyl group.

[Chemical Formula 33]

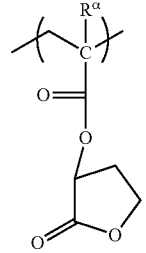
(a2-1-1)

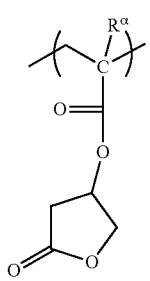
(a2-1-2)

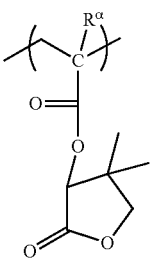
(a2-1-3)

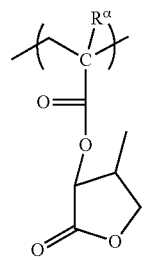
(a2-1-4)

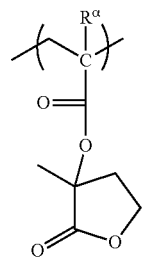
(a2-1-5)

(a2-1-6)
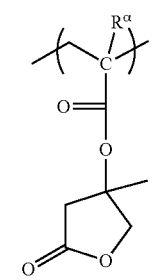
(a2-1-7)
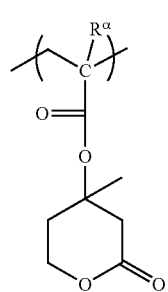
(a2-1-8)
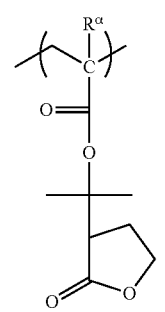
(a2-1-9)
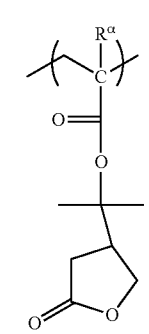
(a2-1-10)
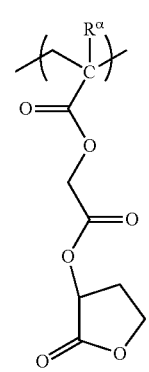
(a2-1-11)
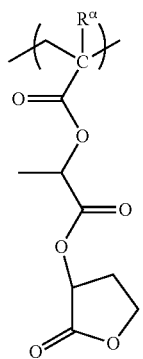
(a2-1-12)
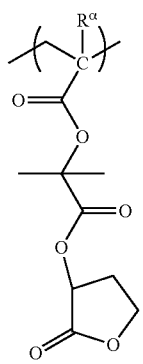
(a2-1-13)
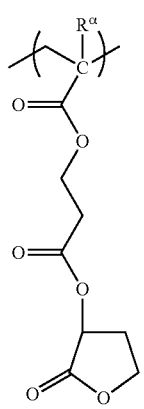
[Chemical Formula 34]
(a2-2-1)
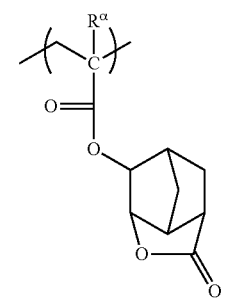

(a2-2-2) 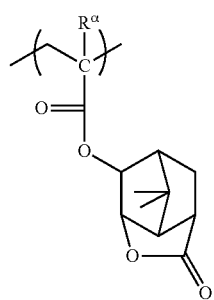
(a2-2-3) 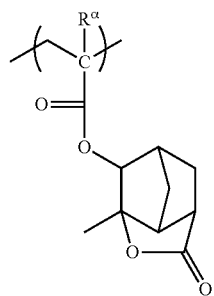
(a2-2-4) 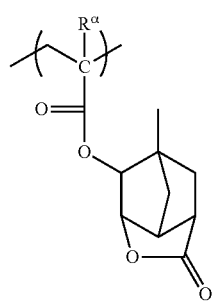
(a2-2-5) 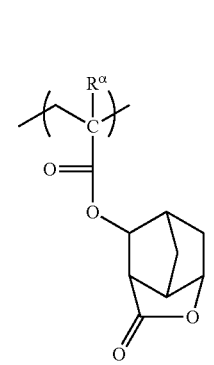
(a2-2-6) 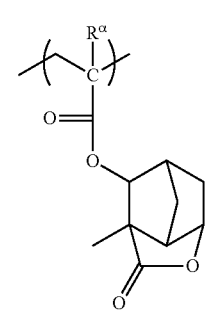
(a2-2-7) 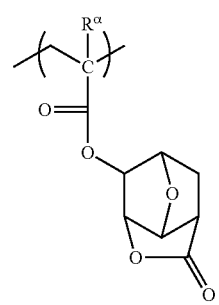
(a2-2-8) 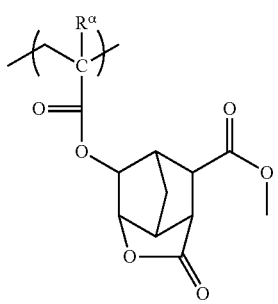
(a2-2-9) 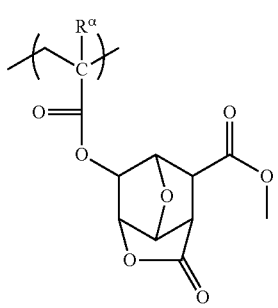
(a2-2-10) 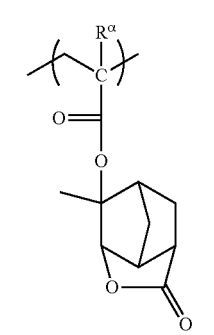
(a2-2-11) 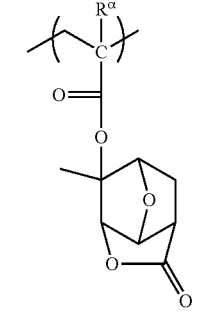

(a2-2-12)
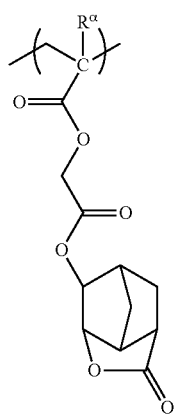
(a2-2-13)
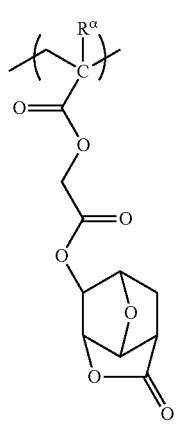
(a2-2-14)
(a2-2-15)
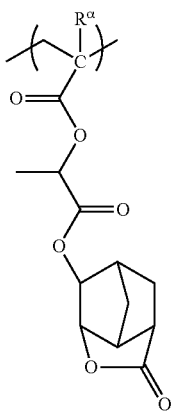
(a2-2-16)
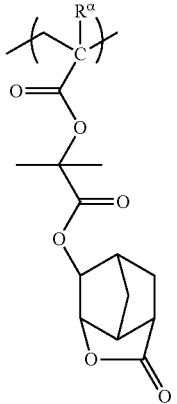
(a2-2-17)
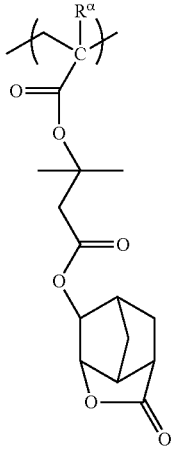
[Chemical Formula 35]
(a2-3-1)
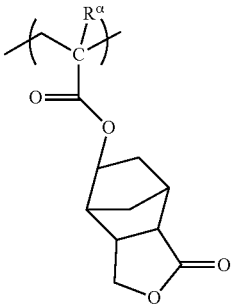

(a2-3-2)
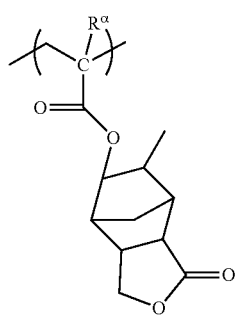
(a2-3-3)
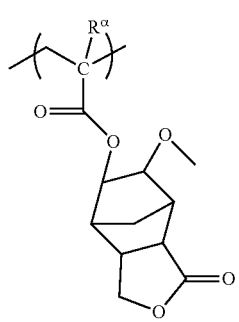
(a2-3-4)
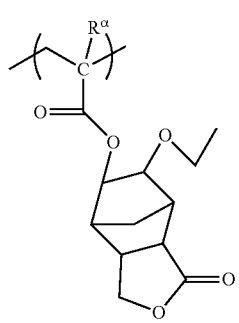
(a2-3-5)
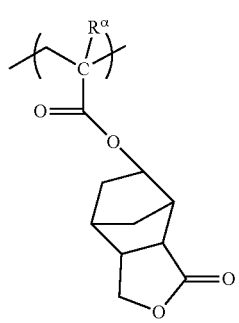
[Chemical Formula 36]
(a2-4-1)
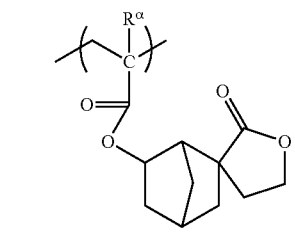
(a2-4-2)
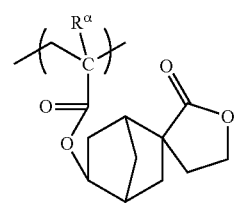
(a2-4-3)
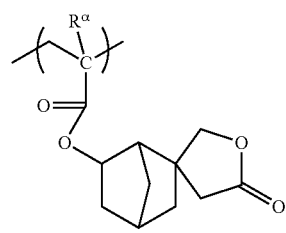
(a2-4-4)
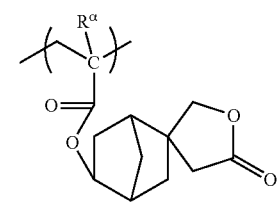
(a2-4-5)
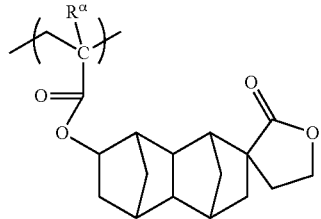
(a2-4-6)
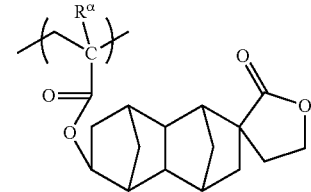
(a2-4-7)
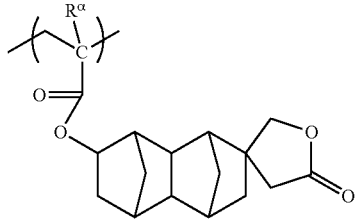
(a2-4-8)
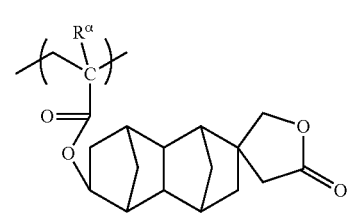

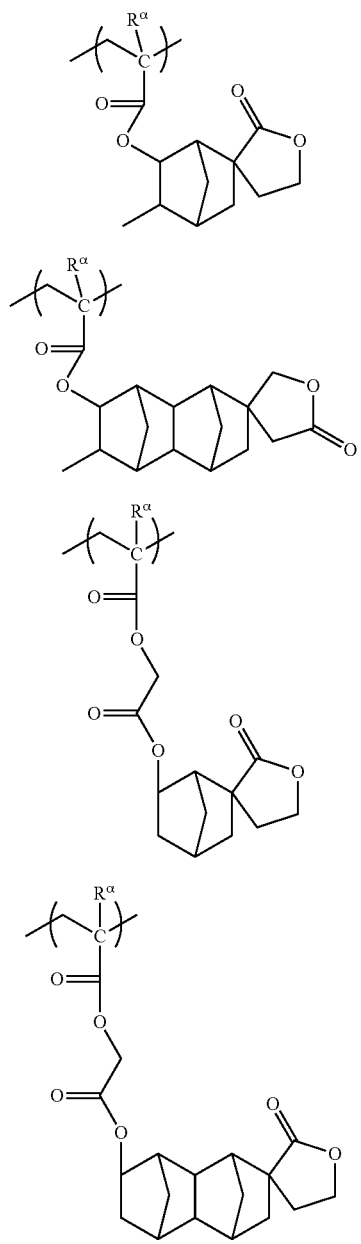
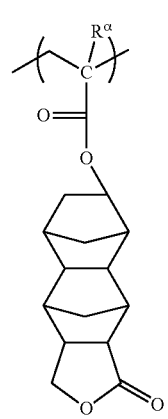
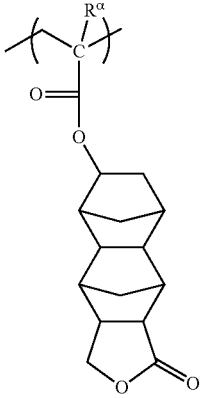
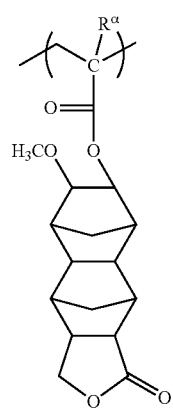
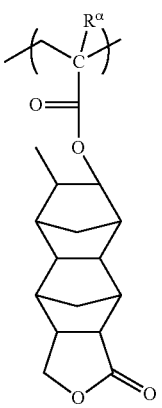

-continued

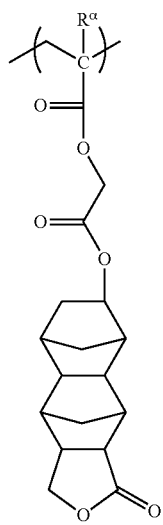

(a2-5-5)

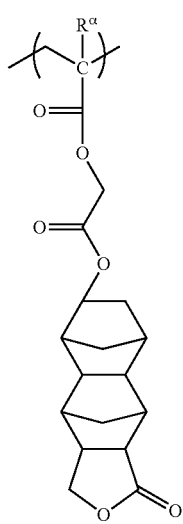

(a2-5-6)

The structural unit (a2$^L$) is preferably at least one structural unit selected from the group consisting of structural units represented by general formulas (a2-1) to (a2-5), is more preferably at least one structural unit selected from the group consisting of structural units represented by general formulas (a2-1) to (a2-3), and is still more preferably at least one structural unit selected from the group consisting of structural units represented by general formulas (a2-1) and (a2-3).

Among these structural units, the structural unit (a2$^L$) is preferably at least one structural unit selected from the group consisting of structural units represented by the above formulas (a2-1-1), (a2-1-2), (a2-2-1), (a2-2-7), (a2-2-12), (a2-2-14), (a2-3-1) and (a2-3-5).

In the component (A1), as the structural unit (a2), one type of structural unit may be used alone, or two or more types of structural units may be used in combination. For example, the structural unit (a2$^S$) may be used alone as the structural unit (a2), the structural unit (a2$^L$) may be used alone, or the structural units (a2$^S$) and (a2$^L$) may be used in combination. Further, as the structural unit (a2$^S$) or the structural unit (a2$^L$), one type of structural unit may be used alone, or two or more types of structural units may be used in combination.

In the present invention, in terms of achieving superior effects for the present invention, the structural unit (a2) preferably includes at least the structural unit (a2$^L$).

The amount of the structural unit (a2) within the component (A1), based on the combined total of all the structural units that constitute the component (A1), is preferably within a range from 1 to 80 mol %, more preferably from 10 to 70 mol %, still more preferably from 10 to 65 mol %, and most preferably from 10 to 60 mol %. When the amount of the structural unit (a2) is at least as large as the lower limit of the above range, the effects achieved be including the structural unit (a2) to be satisfactorily realized, whereas when the amount of the structural unit (a2) is not more than the upper limit of the above range, a good balance can be achieved with the other structural units, and lithography properties such as DOF and CDU and the pattern shape can all be improved.

(Structural Unit (a3))

The structural unit (a3) is a structural unit (a3) which contains a polar group-containing aliphatic hydrocarbon group and is derived from an acrylate ester in which the hydrogen atom bonded to the carbon atom on the α-position may be substituted with a substituent.

When the component (A1) includes the structural unit (a3), the hydrophilicity of the component (A) is improved, which contributes to a favorable improvement in the resolution.

Examples of the polar group include a hydroxyl group, cyano group, carboxyl group, or hydroxyalkyl group in which part of the hydrogen atoms of the alkyl group have each been substituted with a fluorine atom, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups).

These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that includes an aliphatic polycyclic group containing a hydroxyl group, cyano group, carboxyl group or a hydroxyalkyl group in which part of the hydrogen atoms of the alkyl group have each been substituted with a fluorine atom are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 38]

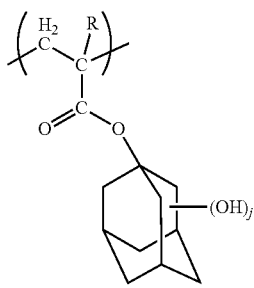
(a3-1)

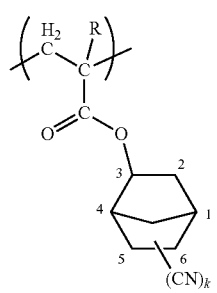
(a3-2)

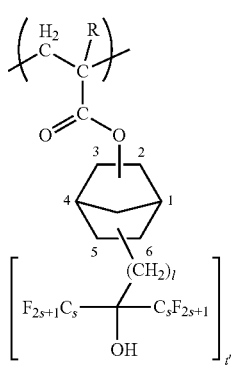
(a3-3)

In the formula, R is the same as defined above, j is an integer of 1 to 3, k is an integer of 1 to 3, t' is an integer of 1 to 3, l is an integer of 1 to 5, and s is an integer of 1 to 3.

In formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

j is preferably 1, and it is particularly desirable that the hydroxyl group is bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

As the structural unit (a3), one type of structural unit may be used alone, or two or more types of structural units may be used in combination.

The amount of the structural unit (a3) within the component (A1), based on the combined total of all the structural units that constitute the component (A1), is preferably within a range from 1 to 50 mol %, more preferably from 3 to 45 mol %, and still more preferably from 5 to 40 mol %. When the amount of the structural unit (a3) is at least as large as the lower limit of the above range, the effects achieved be including the structural unit (a3) can be satisfactorily realized. On the other hand, when the amount of the structural unit (a3) is not more than the upper limit of the above range, a good balance can be achieved with the other structural units.

(Other Structural Units)

The component (A1) may also include a structural unit other than the aforementioned structural units (a1) to (a3) (hereinafter referred to as "structural unit (a4)"), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

Preferred examples of the structural unit (a4) include a structural unit which contains a non-acid-dissociable aliphatic polycyclic group and is derived from an acrylate ester in which the hydrogen atom bonded to the carbon atom on the α-position may be substituted with a substituent, a structural unit derived from a styrene monomer, and a structural unit derived from a vinylnaphthalene monomer. Examples of the above polycyclic group include the same groups as those described above in connection with the structural unit (a1), and any of the multitude of conventional polycyclic groups used within the resin component of resist compositions designed for ArF excimer lasers can be used.

In consideration of industrial availability and the like, at least one polycyclic group selected from among a tricyclodecanyl group, adamantyl group, tetracyclododecanyl group, isobornyl group and norbornyl group is particularly desirable. These polycyclic groups may be substituted with a linear or branched alkyl group of 1 to 5 carbon atoms.

Specific examples of the structural unit (a4) include units with structures represented by general formulas (α-4-1) to (α-4-5) shown below.

[Chemical Formula 39]

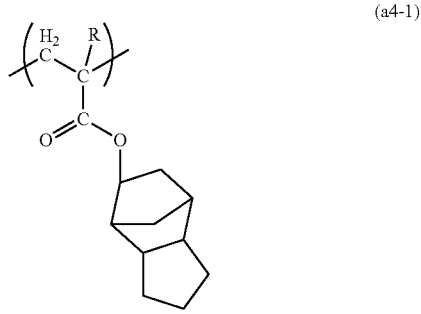
(a4-1)

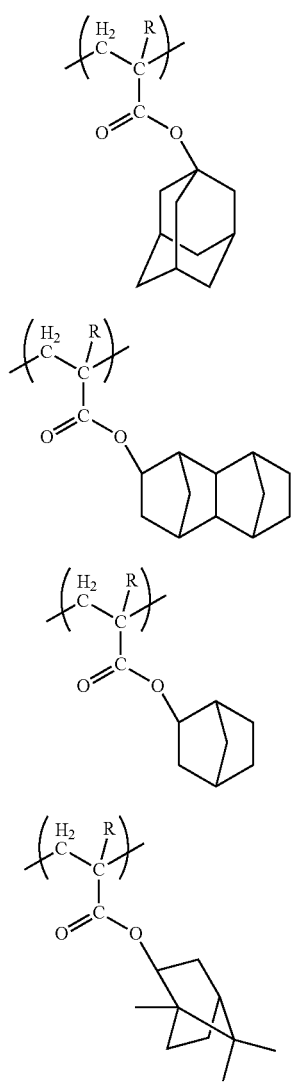

(a4-2)

(a4-3)

(a4-4)

(a4-5)

In the formulas, R is the same as defined above.

As the structural unit (a4), one type of structural unit may be used alone, or two or more types of structural units may be used in combination.

When the structural unit (a4) is included in the component (A1), the amount of the structural unit (a4), based on the combined total of all the structural units that constitute the component (A1), is preferably within the range from 1 to 20 mol %, more preferably from 1 to 15 mol %, and still more preferably from 1 to 10 mol %.

The component (A1) is preferably a copolymer containing the structural unit (a1).

Examples of such copolymers include copolymers consisting of the structural units (a1) and (a3), copolymers consisting of the structural units (a1) and (a2), and copolymers consisting of the structural units (a1), (a2) and (a3).

In the present invention, as the component (A1), a copolymer that includes a combination of structural units represented by general formula (A1-11) shown below is particularly preferred. In the general formula below, R, $R^{29}$, A", R', s", $R^{11}$ and j are each the same as defined above, and the plurality of R groups, $R^{29}$ groups and R' groups in the formula may each be the same or different from each other.

[Chemical Formula 40]

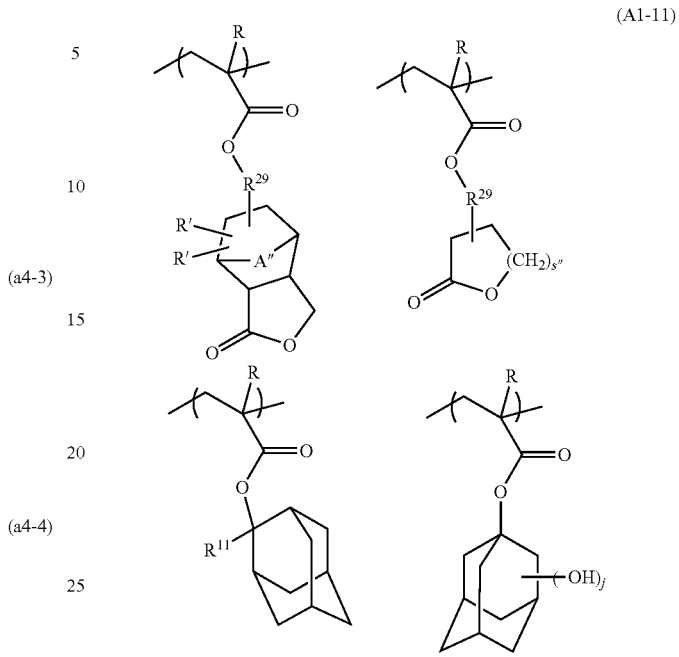

(A1-11)

The weight-average molecular weight (Mw) (the polystyrene equivalent value determined by gel permeation chromatography) of the component (A1) is not particularly limited, but is preferably within a range from 1,000 to 50,000, more preferably from 1,500 to 30,000, and most preferably from 2,500 to 20,000. When the weight average molecular weight is not more than the upper limit of the above range, the polymeric compound (A1) exhibits satisfactory solubility in a resist solvent when used as a resist. On the other hand, when the weight average molecular weight is at least as large as the lower limit of the aforementioned range, dry etching resistance and the cross-sectional shape of the resist pattern are improved.

Further, although there are no particular limitations on the dispersity (Mw/Mn) of the component (A1), the dispersity is preferably from 1.0 to 5.0, more preferably from 1.0 to 3.0, and most preferably from 1.2 to 2.5.

Here, Mn represents the number-average molecular weight.

In the component (A), either a single component (A1) may be used alone, or two or more different types of the component (A1) may be used in combination.

The amount of the component (A1) within the component (A), based on the total weight of the component (A), is preferably not less than 25% by weight, more preferably 50% by weight or more, and still more preferably 75% by weight or more. The amount of the component (A1) may also represent 100% by weight of the component (A). Provided the amount is not less than 25% by weight, various lithography properties are improved.

[Component (A2)]

The component (A2) is preferably a low molecular weight compound that has a molecular weight of at least 500 but less than 4,000, contains a hydrophilic group, and also contains an acid-dissociable group as described above in connection with the component (A1). Specific examples of the component (A2) include compounds containing a plurality of phenol structures in which part of the hydrogen atoms of the hydroxyl groups have each been substituted with an aforementioned acid-dissociable groups.

Examples of the component (A2) include low molecular weight phenolic compounds in which a portion of the hydroxyl group hydrogen atoms have each been substituted with an aforementioned acid-dissociable group. These types of compounds are known, for example, as sensitizers or heat resistance improvers for use in non-chemically amplified g-line or i-line resists, and any of these compounds may be used.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane structures is preferable, as such compounds yield superior levels of resolution and LWR.

There are no particular limitations on the acid-dissociable group, and examples include the groups described above.

A single component (A2) may be used alone, or two or more different types of the component (A2) may be used in combination.

In the resist composition of the present invention, a single component (A) may be used alone, or two or more different types of the component (A) may be used in combination.

Of the various possibilities, the component (A) preferably includes the component (A1).

In the resist composition of the present invention, the amount of the component (A) can be adjusted appropriately depending on factors such as the thickness of the resist film that is to be formed.

<Component (B)>

There are no particular limitations on the component (B), and any of the known acid generators used in conventional chemically amplified resist compositions can be used. Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

As an onium salt acid generator, a compound represented by general formula (b-1) or (b-2) shown below may be used.

[Chemical Formula 41]

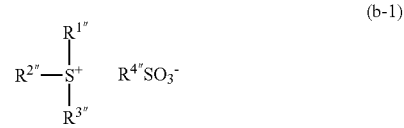

In the formulas, each of $R^{1\prime\prime}$ to $R^{3\prime\prime}$, $R^{5\prime\prime}$ and $R^{6\prime\prime}$ independently represents an aryl group or alkyl group, wherein two of $R^{1\prime\prime}$ to $R^{3\prime\prime}$ in formula (b-1) may be bonded to each other to form a ring together with the sulfur atom in the formula, and $R^{4\prime\prime}$ represents an alkyl group, halogenated alkyl group, aryl group or alkenyl group which may have a substituent.

In formula (b-1), each of $R^{1\prime\prime}$ to $R^{3\prime\prime}$ independently represents an aryl group or an alkyl group. In formula (b-1), two of $R^{1\prime\prime}$ to $R^{3\prime\prime}$ may be bonded to each other to form a ring together with the sulfur atom in the formula.

Further, among $R^{1\prime\prime}$ to $R^{3\prime\prime}$, at least one group preferably represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

There are no particular limitations on the aryl group for $R^{1\prime\prime}$ to $R^{3\prime\prime}$. For example, an aryl group having 6 to 20 carbon atoms may be used in which part or all of the hydrogen atoms of the aryl group may or may not each be substituted with an alkyl group, alkoxy group, halogen atom or hydroxyl group.

The aryl group is preferably an aryl group having 6 to 10 carbon atoms because such groups enable synthesis to be performed at low cost. Specific examples include a phenyl group and a naphthyl group.

The alkyl group with which a hydrogen atom of the aryl group may be substituted is preferably an alkyl group having 1 to 5 carbon atoms, and most preferably a methyl group, ethyl group, propyl group, n-butyl group or tert-butyl group.

The alkoxy group with which a hydrogen atom of the aryl group may be substituted is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

The halogen atom with which a hydrogen atom of the aryl group may be substituted is preferably a fluorine atom.

There are no particular limitations on the alkyl group for $R^{1\prime\prime}$ to $R^{3\prime\prime}$, and examples includes linear, branched and cyclic alkyl groups having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group and decyl group, and a methyl group is most preferable because it yields excellent resolution and enables synthesis to be performed at low cost.

When two of $R^{1\prime\prime}$ to $R^{3\prime\prime}$ in formula (b-1) are bonded to each other to form a ring together with the sulfur atom in the formula, it is preferable that the two of $R^{1\prime\prime}$ to $R^{3\prime\prime}$ form a 3- to 10-membered ring including the sulfur atom, and it is particularly desirable that the two of $R^{1\prime\prime}$ to $R^{3\prime\prime}$ form a 5- to 7-membered ring including the sulfur atom.

When two of $R^{1\prime\prime}$ to $R^{3\prime\prime}$ in formula (b-1) are bonded to each other to form a ring together with the sulfur atom in the formula, the remaining one of $R^{1\prime\prime}$ to $R^{3\prime\prime}$ is preferably an aryl group. Examples of this aryl group include the same aryl groups as those described above for $R^{1\prime\prime}$ to $R^{3\prime\prime}$.

Examples of preferred cation moieties for the compound represented by general formula (b-1) include the cation moieties represented by formulas (I-1-1) to (I-1-10) shown below. Among these, a cation moiety having a triphenylmethane skeleton, such as a cation moiety represented by any one of formulas (I-1-1) to (I-1-8) shown below, is particularly desirable.

In formulas (I-1-9) and (I-1-10) below, each of $R^9$ and $R^{10}$ independently represents a phenyl group or naphthyl group which may have a substituent, an alkyl group of 1 to 5 carbon atoms, an alkoxy group of 1 to 5 carbon atoms, or a hydroxyl group.

Examples of the above substituent include the same alkyl groups, alkoxy groups, and halogen atoms as those with which a hydrogen atom of the above aryl group may be substituted.

u is an integer of 1 to 3, and most preferably 1 or 2.

[Chemical Formula 42]

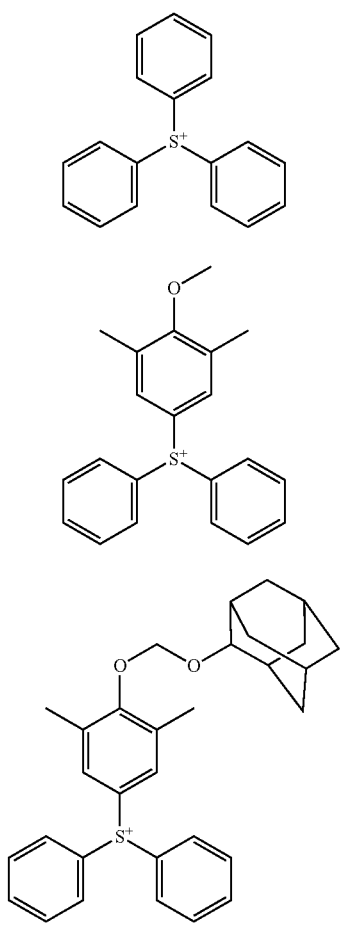

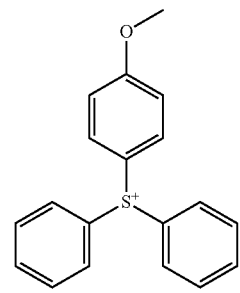

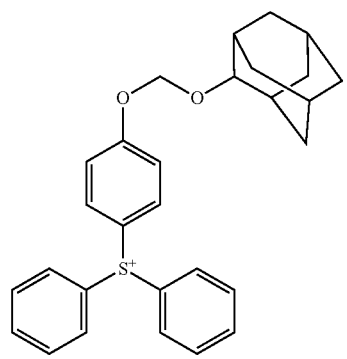

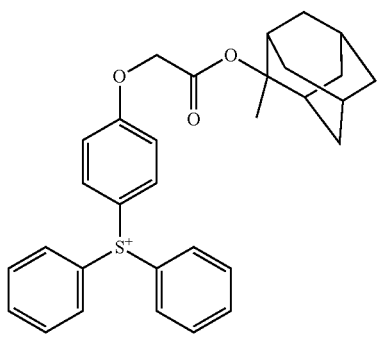

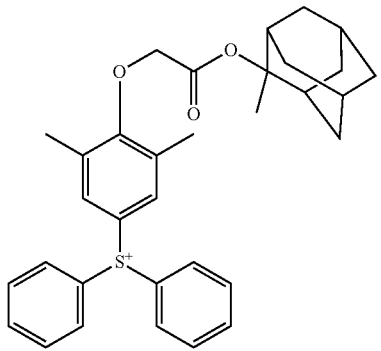

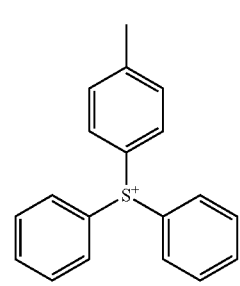

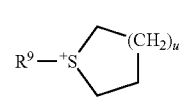
(I-1-9)

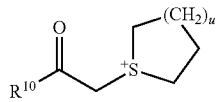
(I-1-10)

$R^{4\prime\prime\prime}$ represents an alkyl group, halogenated alkyl group, aryl group or alkenyl group which may have a substituent.

The alkyl group for $R^{4\prime\prime\prime}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

Examples of the halogenated alkyl group for $R^{4\prime\prime\prime}$ include groups in which part or all of the hydrogen atoms of an aforementioned linear, branched or cyclic alkyl group have each been substituted with a halogen atom. Examples of the halogen atom include a fluorine atom, chlorine atom, bromine atom and iodine atom, and a fluorine atom is preferable.

In the halogenated alkyl group, the percentage of the number of halogen atoms relative to the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4\prime\prime\prime}$ is preferably an aryl group of 6 to 20 carbon atoms.

The alkenyl group for $R^{4\prime\prime\prime}$ is preferably an alkenyl group of 2 to 10 carbon atoms.

With respect to $R^{4\prime\prime\prime}$, the expression "may have a substituent" means that part or all of the hydrogen atoms within the aforementioned linear, branched or cyclic alkyl group, halogenated alkyl group, aryl group or alkenyl group may each be substituted with a substituent (an atom other than a hydrogen atom, or a group).

$R^{4\prime\prime\prime}$ may have one substituent, or two or more substituents.

Examples of the substituent include a halogen atom, a hetero atom, an alkyl group, and a group represented by the formula $X-Q^1-$ (wherein $Q^1$ represents a divalent linking group containing an oxygen atom, and X represents a hydrocarbon group of 3 to 30 carbon atoms which may have a substituent).

Examples of the halogen atom and alkyl group as substituents for $R^{4\prime\prime\prime}$ include the same halogen atoms and alkyl groups as those described above with respect to the halogenated alkyl group for $R^{4\prime\prime\prime}$.

Examples of the hetero atom include an oxygen atom, a nitrogen atom and a sulfur atom.

In the group represented by formula $X-Q^1-$, $Q^1$ represents a divalent linking group containing an oxygen atom.

$Q^1$ may also contain atoms other than the oxygen atom. Examples of these atoms other than the oxygen atom include a carbon atom, hydrogen atom, sulfur atom and nitrogen atom.

Examples of the divalent linking group containing an oxygen atom include non-hydrocarbon, oxygen atom-containing linking groups such as an oxygen atom (an ether bond, —O—), an ester linkage (—C(=O)—O—), an amide linkage (—C(=O)—NH—), a carbonyl group (—C(=O)—), a carbonate linkage (—O—C(=O)—O—), and combinations of these non-hydrocarbon, oxygen atom-containing linking groups with an alkylene group.

Specific examples of the combinations of the non-hydrocarbon, oxygen atom-containing linking groups and an alkylene group include —$R^{91}$—O—, —$R^{92}$—O—C(=O)— and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably contains 1 to 12 carbon atoms, more preferably 1 to 5 carbon atoms, and most preferably 1 to 3 carbon atoms.

Specific examples of the alkylene group include a methylene group [—$CH_2$—], alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—, an ethylene group [—$CH_2CH_2$—], alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, a trimethylene group (n-propylene group) [—$CH_2CH_2CH_2$—], alkyltrimethylene groups such as —CH($CH_3$)$CH_2CH_2$— and —$CH_2$CH($CH_3$)$CH_2$—, a tetramethylene group [—$CH_2CH_2CH_2CH_2$—], alkyltetramethylene groups such as —CH($CH_3$)$CH_2CH_2CH_2$— and —$CH_2$CH($CH_3$)$CH_2CH_2$—, and a pentamethylene group [—$CH_2CH_2CH_2CH_2CH_2$—].

$Q^1$ is preferably a divalent linking group containing an ester linkage or ether linkage, and is more preferably a group represented by —$R^{91}$—O—, —$R^{92}$—O—C(=O)— or —C(=O)—O—$R^{93}$—O—C(=O)—.

In the group represented by the formula $X-Q^1-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within substituents is not included in the number of carbon atoms of the aromatic hydrocarbon group.

Specific examples of the aromatic hydrocarbon group include aryl groups, which are aromatic hydrocarbon rings having one hydrogen atom removed therefrom, such as a phenyl group, biphenylyl group, fluorenyl group, naphthyl group, anthryl group and phenanthryl group, and arylalkyl groups such as a benzyl group, phenethyl group, 1-naphthylmethyl group, 2-naphthylmethyl group, 1-naphthylethyl group and 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, part of the carbon atoms that constitute the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which part of the carbon atoms that constitute the ring within an aforementioned aryl group have been substituted with a hetero atom such as an oxygen atom, a sulfur atom or a nitrogen atom, and heteroarylalkyl groups in which part of the carbon atoms that constitute the aromatic hydrocarbon ring within an aforementioned arylalkyl group have been substituted with an aforementioned hetero atom.

In the latter case, examples of the substituent for the aromatic hydrocarbon group include an alkyl group, alkoxy group, halogen atom, halogenated alkyl group, hydroxyl group or oxygen atom (=O) or the like.

The alkyl group as the substituent for the aromatic hydrocarbon group is preferably an alkyl group of 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms within an aforementioned alkyl group have each been substituted with an aforementioned halogen atom.

The aliphatic hydrocarbon group for X may be either a saturated aliphatic hydrocarbon group or an unsaturated aliphatic hydrocarbon group. Further, the aliphatic hydrocarbon group may be linear, branched or cyclic.

In the aliphatic hydrocarbon group for X, part of the carbon atoms that constitute the aliphatic hydrocarbon group may be substituted with a substituent containing a hetero atom, or part or all of the hydrogen atoms that constitute the aliphatic hydrocarbon group may each be substituted with a substituent containing a hetero atom.

There are no particular limitations on this "hetero atom" within X, provided it is an atom other than carbon and hydrogen. Examples of the hetero atom include a halogen atom, oxygen atom, sulfur atom and nitrogen atom. Examples of the halogen atom include a fluorine atom, chlorine atom, iodine atom and bromine atom.

The substituent containing a hetero atom may consist solely of the hetero atom, or may be a group that also contains a group or atom other than the hetero atom.

Specific examples of the substituent for substituting part of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent for substituting part or all of the hydrogen atoms include an alkoxy group, halogen atom, halogenated alkyl group, hydroxyl group, oxygen atom (=O) and cyano group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 43]

(L1) 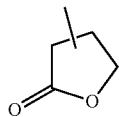

(L2) 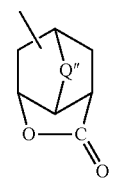

(L3) 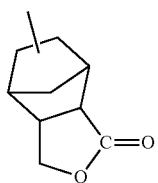

(L4) 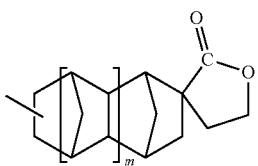

(L5) 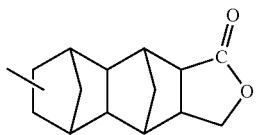

(L6) 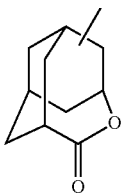

(S1) 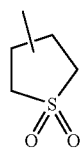

(S2) 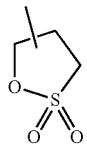

(S3) 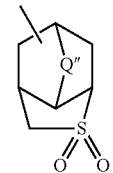

(S4) 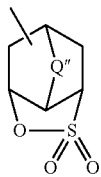

In the formulas, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms), and m represents an integer of 0 or 1.

Examples of the alkylene groups for Q", $R^{94}$ and $R^{95}$ include the same alkylene groups as those described above for $R^{91}$ to $R^{93}$.

In these aliphatic cyclic groups, part of the hydrogen atoms bonded to the carbon atoms that constitute the ring structure may each be substituted with a substituent. Examples of this substituent include an alkyl group, alkoxy group, halogen atom, halogenated alkyl group, hydroxyl group or oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting part or all of the hydrogen atoms of the aliphatic hydrocarbon group for X.

In the present invention, X is preferably a cyclic group which may have a substituent. This cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic cyclic group which may have a substituent is preferable. As this polycyclic aliphatic cyclic group, groups in which one or more hydrogen atoms have been removed from an aforementioned polycycloalkane, and groups represented by the above formulas (L2) to (L6), and (S3) and (S4) are preferable.

In the present invention, $R^{4\prime\prime\prime}$ preferably has X-$Q^1$- as a substituent. In such a case, $R^{4\prime\prime\prime}$ is preferably a group represented by the formula X—$Q^1$-$Y^1$— (wherein $Q^1$ and X are the same as defined above, and $Y^1$ represents an alkylene group of 1 to 4 carbon atoms which may have a substituent, or a fluorinated alkylene group of 1 to 4 carbon atoms which may have a substituent).

In the group represented by the formula X-$Q^1$-$Y^1$—, examples of the alkylene group represented by $Y^1$ include those alkylene groups described above for $Q^1$ in which the number of carbon atoms is within a range from 1 to 4.

Examples of the fluorinated alkylene group for $Y^1$ include groups in which part or all of the hydrogen atoms of an above-mentioned alkylene group have each been substituted with fluorine atoms.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —CF ($CF_2CF_2CF_3$)—, —$C(CF_3)(CF_2CF_3)$—; —CHF—, —$CH_2CF_2$—, —$CH_2CH_2CF_2$—, —$CH_2CF_2CF_2$—, —CH($CF_3$)$CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2CH(CF_3)CH_2$—, —CH($CF_3$)CH($CF_3$)—, —C($CF_3$)$_2CH_2$—; —$CH_2$—, —$CH_2CH_2$—, —$CH_2CH_2CH_2$—, —CH($CH_3$)$CH_2$—, —CH($CH_2CH_3$)—, —C($CH_3$)$_2$—, —$CH_2CH_2CH_2CH_2$—, —CH($CH_3$)$CH_2CH_2$—, —$CH_2CH(CH_3)CH_2$—, —CH($CH_3$)CH($CH_3$)—, —C($CH_3$)$_2CH_2$—, —CH($CH_2CH_3$)$CH_2$—, —CH($CH_2CH_2CH_3$)— and —C($CH_3$)($CH_2CH_3$)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —CF($CF_3$)$CF_2$—, —$CF_2CF_2CF_2CF_2$—, —CF($CF_3$)$CF_2CF_2$—, —$CF_2CF(CF_3)CF_2$—, —CF($CF_3$)CF($CF_3$)—, —C($CF_3$)$_2CF_2$—, —CF($CF_2CF_3$)$CF_2$—, —$CH_2CF_2$—, —$CH_2CH_2CF_2$—, —$CH_2CF_2CF_2$—, —$CH_2CH_2CH_2CF_2$—, —$CH_2CH_2CF_2CF_2$— and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group.

Examples of substituents with which the alkylene group or fluorinated alkylene group may be substituted include alkyl groups of 1 to 4 carbon atoms, alkoxy groups of 1 to 4 carbon atoms, and a hydroxyl group.

In formula (b-2), each of $R^{5'''}$ and $R^{6'''}$ independently represents an aryl group or an alkyl group. At least one of $R^{5'''}$ and $R^{6'''}$ preferably represents an aryl group, and it is more desirable that both of $R^{5'''}$ and $R^{6'''}$ are aryl groups.

Examples of the aryl group for $R^{5'''}$ and $R^{6'''}$ include the same aryl groups as those described for $R^{1'''}$ to $R^{3'''}$.

Examples of the alkyl group for $R^{5'''}$ and $R^{6'''}$ include the same alkyl groups as those described for $R^{1'''}$ to $R^{3'''}$.

Among the various possibilities, the case in which $R^{5'''}$ and $R^{6'''}$ are both phenyl groups is the most desirable.

Examples of $R^{4'''}$ within formula (b-2) include the same groups as those described above for $R^{4'''}$ within formula (b-1).

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate, such as methanesulfonate, n-propanesulfonate, n-butanesulfonate, n-octanesulfonate, 1-adamantanesulfonate, 2-norbornanesulfonate or d-camphor-10-sulfonate, or replaced by an aromatic sulfonate, such as benzenesulfonate, perfluorobenzenesulfonate or p-toluenesulfonate.

Furthermore, onium salts in which the anion moiety of these onium salts has been replaced by an anion moiety represented by any one of formulas (b1) to (b8) shown below can also be used.

[Chemical Formula 44]

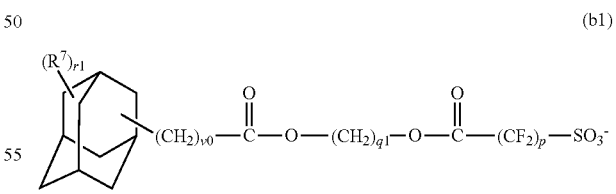

(b1)

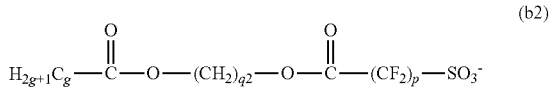

(b2)

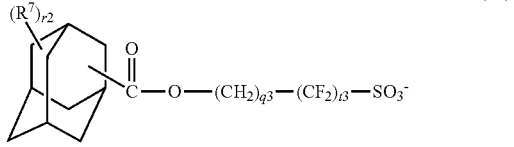

(b3)

-continued

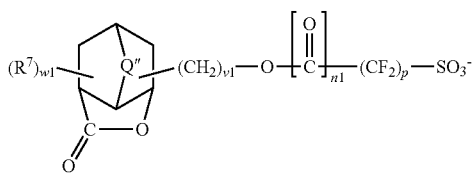
(b4)

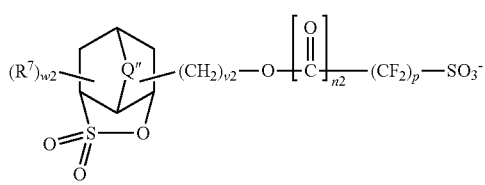
(b5)

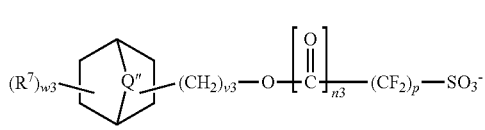
(b6)

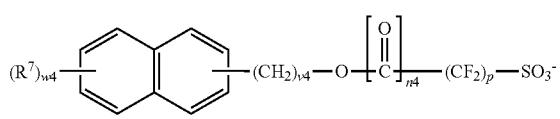
(b7)

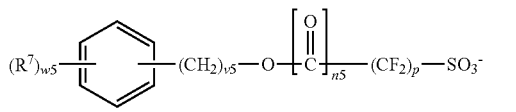
(b8)

In the formulas, p represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, g represents an integer of 1 to 20, $R^7$ represents a substituent, each of n1 to n5 independently represents 0 or 1, each of v0 to v5 independently represents an integer of 0 to 3, each of w1 to w5 independently represents an integer of 0 to 3, and Q" is the same as defined above.

Examples of the substituent for $R^7$ include the same groups as those which the aforementioned aliphatic hydrocarbon group or aromatic hydrocarbon group for X may have as a substituent.

If there are two or more of the $R^7$ group, as indicated by the values r1, r2, and w1 to w5, then the plurality of $R^7$ groups may be the same or different from each other.

Further, onium salt acid generators in which the anion moiety in general formula (b-1) or (b-2) has been replaced by an anion moiety represented by general formula (b-3) or (b-4) shown below (but in which the cation moiety is the same as the cation shown in formula (b-1) or (b-2)) may also be used as the onium salt acid generator.

[Chemical Formula 45]

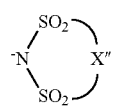
(b-3)

-continued

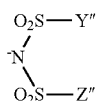
(b-4)

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, wherein the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, wherein the alkyl group has 1 to 10 carbon atoms, preferably 1 to 7 carbon atoms, and most preferably 1 to 3 carbon atoms.

The smaller the number of carbon atoms in the alkylene group for X" or the alkyl group for Y" and Z" within the above-mentioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or electron beam is improved.

The proportion of fluorine atoms within the alkylene group or alkyl group, namely the fluorination ratio, is preferably within a range from 70 to 100%, and more preferably from 90 to 100%. A perfluoroalkylene or perfluoroalkyl group in which all the hydrogen atoms are substituted with fluorine atoms is the most desirable.

Furthermore, a sulfonium salt having a cation moiety represented by general formula (b-5) or (b-6) shown below may also be used as an onium salt acid generator.

[Chemical Formula 46]

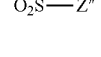
(b-5)

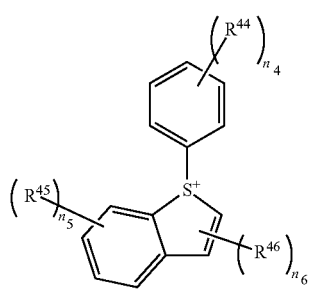

(b-6)

In the above formulas, each of $R^{41}$ to $R^{46}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

The alkyl group for $R^{41}$ to $R^{46}$ is preferably an alkyl group of 1 to 5 carbon atoms, more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have each been substituted with a hydroxyl group, and examples thereof include a hydroxymethyl group, hydroxyethyl group and hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

There are no particular limitations on the anion moiety of the sulfonium salt having a cation moiety represented by general formula (b-5) or (b-6), and the same anion moieties as those used for conventional onium salt-based acid generators that have been proposed may be used. Examples of such anion moieties include fluorinated alkylsulfonate ions such as the anion moieties ($R^{4"}SO_3^-$) illustrated for onium salt-based acid generators represented by general formula (b-1) or (b-2) shown above, and anion moieties represented by general formula (b-3) or (b-4) shown above.

In the present description, an oxime sulfonate acid generator is a compound having at least one group represented by general formula (B-1) shown below, and has a feature of generating acid upon irradiation. Such oxime sulfonate acid generators are widely used for chemically amplified resist compositions, and any of these known compounds may be selected as appropriate.

[Chemical Formula 47]

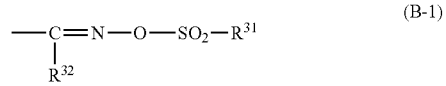

(B-1)

In formula (B-1), each of $R^{31}$ and $R^{32}$ independently represents an organic group.

The organic group for $R^{31}$ and $R^{32}$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

The organic group for $R^{31}$ is preferably a linear, branched or cyclic alkyl group, or an aryl group. The alkyl group or aryl group may have a substituent. There are no particular limitations on the substituent, and examples include a fluorine atom or a linear, branched or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. A "partially halogenated alkyl group" refers to an alkyl group in which part of the hydrogen atoms are each substituted with a halogen atom, whereas a "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which part of the hydrogen atoms are each substituted with a halogen atom, whereas a "completely halogenated aryl group" refers to an aryl group in which all of hydrogen atoms are substituted with halogen atoms.

As the organic group for $R^{31}$, an alkyl group of 1 to 4 carbon atoms which has no substituent, or a fluorinated alkyl group of 1 to 4 carbon atoms is particularly desirable.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

As the organic group for $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 48]

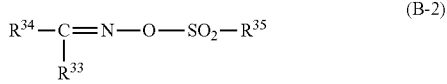

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 49]

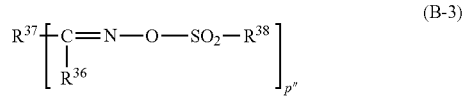

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group and phenanthryl group, and heteroaryl groups in which part of the carbon atoms that constitute the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group, a halogenated alkyl group or an alkoxy group of 1 to 10 carbon atoms. The alkyl group or halogenated alkyl group as the substituent preferably contains 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably contains 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In general formula (B-3), examples of the alkyl group having no substituent and the halogenated alkyl group for $R^{36}$ include the same groups as those described above for the alkyl group having no substituent and the halogenated alkyl group for $R^{33}$.

Examples of the divalent or trivalent aromatic hydrocarbon group for $R^{37}$ include groups in which an additional one or two hydrogen atoms have been removed from the aryl group described above for $R^{34}$.

Examples of the alkyl group having no substituent or the halogenated alkyl group for $R^{38}$ include the same groups as those described above for the alkyl group having no substituent or the halogenated alkyl group for $R^{35}$.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 09-208554 (Chemical Formulas 18 and 19 shown in paragraphs [0012] to [0014]) and oxime sulfonate acid generators disclosed in WO 2004/074242 A2 pamphlet (Examples 1 to 40 described on pages 65 to 86) may also be used favorably.

Furthermore, the following compounds may also be used as preferred examples.

[Chemical Formula 50]

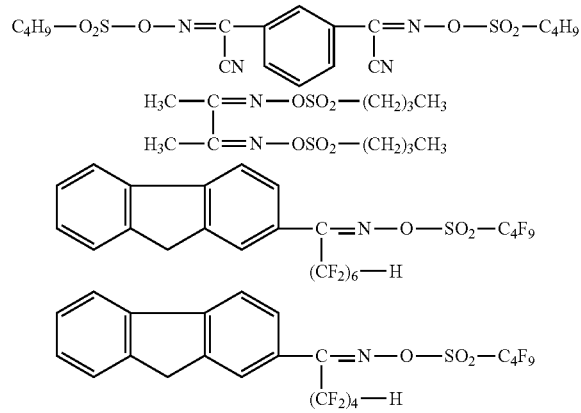

Of the aforementioned diazomethane acid generators, specific examples of suitable bisalkyl or bisaryl sulfonyl diazomethanes include bis(isopropylsulfonyl)diazomethane, bis (p-toluenesulfonyl)diazomethane, bis(1,1-dimethylethylsulfonyl)diazomethane, bis (cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane.

As the component (B), one type of acid generator may be used alone, or two or more types of acid generators may be used in combination.

In the present invention, as the component (B), the use of an onium salt acid generator having a fluorinated alkylsulfonate ion as the anion moiety is preferable.

The amount of the component (B) within a positive resist composition of the present invention is preferably within a range from 0.5 to 50 parts by weight, and more preferably from 1 to 40 parts by weight, relative to 100 parts by weight of the component (A). When the amount of the component (B) is within the above range, formation of a resist pattern can be performed satisfactorily. Further, a uniform solution can be obtained, and the storage stability of the solution tends to improve.

<Component (C)>

The resist composition of the present invention contains a polymeric compound (C) having a structural unit (c0) represented by general formula (c0) shown below (hereinafter also referred to as "component (C)").

[Chemical Formula 51]

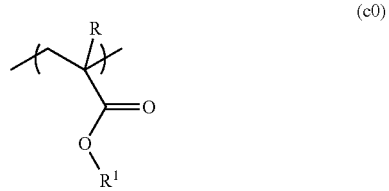

In the formula, R represents a hydrogen atom, an alkyl group of 1 to 5 carbon atoms or a halogenated alkyl group of 1 to 5 carbon atoms, and $R^1$ represents an organic group having one or more primary or secondary alcoholic hydroxyl groups, or a chain-like tertiary alcoholic hydroxyl group.

(Structural Unit (c0))

In formula (c0), R is the same as defined above.

In formula (c0), $R^1$ represents an organic group having one or more primary or secondary alcoholic hydroxyl groups, or a chain-like tertiary alcoholic hydroxyl group.

In the present invention, an "alcoholic hydroxyl group" describes a hydroxyl group bonded to a carbon atom of a chain-like or cyclic hydrocarbon group.

A "chain-like tertiary alcoholic hydroxyl group" is a hydroxyl group that is bonded to a tertiary carbon atom that constitutes part of a chain-like hydrocarbon group. Examples of this chain-like hydrocarbon group include the linear and branched alkyl groups described above for $R^{14}$ in relation to the structural unit (a1).

Further, when the structural unit (c0) contains a primary or secondary alcoholic hydroxyl group, the hydrocarbon group to which the primary or secondary alcoholic hydroxyl group is bonded may be a chain-like group or a cyclic group. Examples of these chain-like and cyclic groups include the linear and branched alkyl groups described above for $R^{14}$ in relation to the structural unit (a1), and the "aliphatic cyclic groups" described for the structural unit (a1).

There are no particular limitations on the organic group for $R^1$, provided it is a group having the type of alcoholic hydroxyl group described above, namely, a group having an alcoholic hydroxyl group and a hydrocarbon group bonded to the alcoholic hydroxyl group.

Specific examples of the organic group for $R^1$ include groups in which an alcoholic hydroxyl group is bonded to the terminal of an alkylene group, a divalent aliphatic cyclic group or a divalent linking group containing a hetero atom. The alkylene group, divalent aliphatic cyclic group and divalent linking group containing a hetero atom are the same as the alkylene group, divalent aliphatic cyclic group and divalent linking group containing a hetero atom described above in relation to the divalent linking group for $Y^2$.

As the structural unit (c0), a structural unit represented by general formula (c0-11) or (c0-12) shown below, a structural unit represented by general formula (c0-21) or (c0-22) shown below, and a structural unit represented by general formula (c0-3) shown below are preferred.

As the structural unit (c0) having a primary alcoholic hydroxyl group, a structural unit represented by general formula (c0-11) or (c0-12) shown below is preferred. As the structural unit (c0) having a secondary alcoholic hydroxyl group, a structural unit represented by general formula (c0-21) or (c0-22) shown below, or a structural unit represented by general formula (c0-12) that does not include a primary alcoholic hydroxyl group is preferred. As the structural unit (c0) having a chain-like tertiary alcoholic hydroxyl group, a structural unit represented by general formula (c0-3) shown below is preferred.

[Chemical Formula 52]

(c0-11) 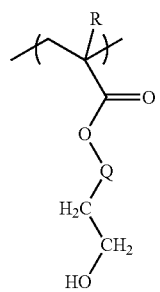

(c0-12) 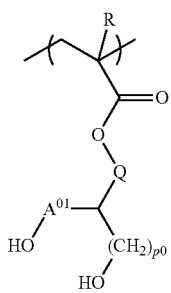

(c0-21) 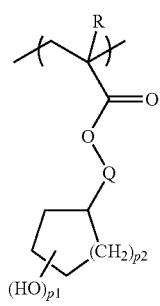

(c0-22) 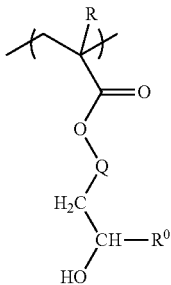

(c0-3) 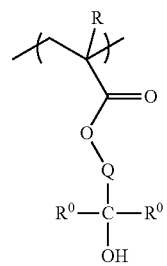

In the formulas, R is the same as defined above, each Q independently represents a single bond, an alkylene group, a divalent aliphatic cyclic group or a divalent linking group containing a hetero atom, $A^{01}$ represents a divalent hydrocarbon group which may have a substituent, each $R^0$ independently represents an alkyl group of 1 to 5 carbon atoms, wherein a plurality of $R^o$ groups within a formula may be the same or different from each other, p0 represents an integer of 0 to 3, p1 represents an integer of 1 to 3, and p2 represents an integer of 0 to 3.

In the above formulas, Q represents a single bond, an alkylene group, a divalent aliphatic cyclic group or a divalent linking group containing a hetero atom. The alkylene group, divalent aliphatic cyclic group and divalent linking group containing a hetero atom are the same as defined above within the description relating to the "organic group".

In the above formula, $A^{01}$ represents a hydrocarbon group which may have a substituent.

The hydrocarbon group for $A^{01}$ is preferably an aliphatic hydrocarbon group, and examples include the same divalent aliphatic hydrocarbon groups as those described for the divalent hydrocarbon group for A within the description of $Y^2$ in the formula (a1-0-2) described in relation to the component (A).

Of these groups, the hydrocarbon group for $A^{01}$ is preferably an alkylene group of 1 to 10 carbon atoms. Further, because the alcoholic hydroxyl group bonded to $A^{01}$ is preferably a primary or secondary alcoholic hydroxyl group or a chain-like tertiary alcoholic hydroxyl group, the alkylene group for $A^{01}$ is preferably a linear or branched alkylene group.

In the aliphatic hydrocarbon group for $A^{01}$, part of the hydrogen atoms that constitute the aliphatic hydrocarbon group may each be substituted. Examples of substituents that may be used for substituting the hydrogen atoms include alkyl groups of 1 to 5 carbon atoms, alkoxy groups, a fluorine atom, fluorinated alkyl groups, a hydroxyl group, an oxygen atom (=O) and a cyano group. Of these, a hydroxyl group or an alkyl group is preferred. When the aliphatic hydrocarbon group includes a hydroxyl group as a substituent, the hydroxyl group is preferably a primary or secondary alcoholic hydroxyl group.

In the above formulas, $R^0$ represents an alkyl group of 1 to 5 carbon atoms, which may be linear or branched. A methyl group or ethyl group is preferred.

In the above formulas, p0 represents an integer of 0 to 3, preferably an integer of 0 to 2, and more preferably 1 or 2. p1 represents an integer of 1 to 3, preferably an integer of 1 or 2, and most preferably 1. p2 represents an integer of 0 to 3, and preferably an integer of 0 or 1.

Specific examples of the structural unit (c0) are shown below. In the following formulas, R is the same as defined above.

[Chemical Formula 53]

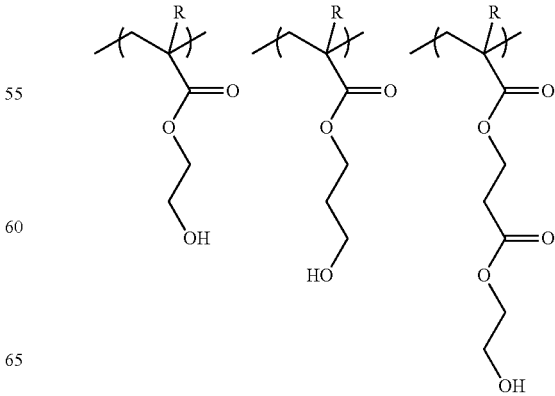

-continued
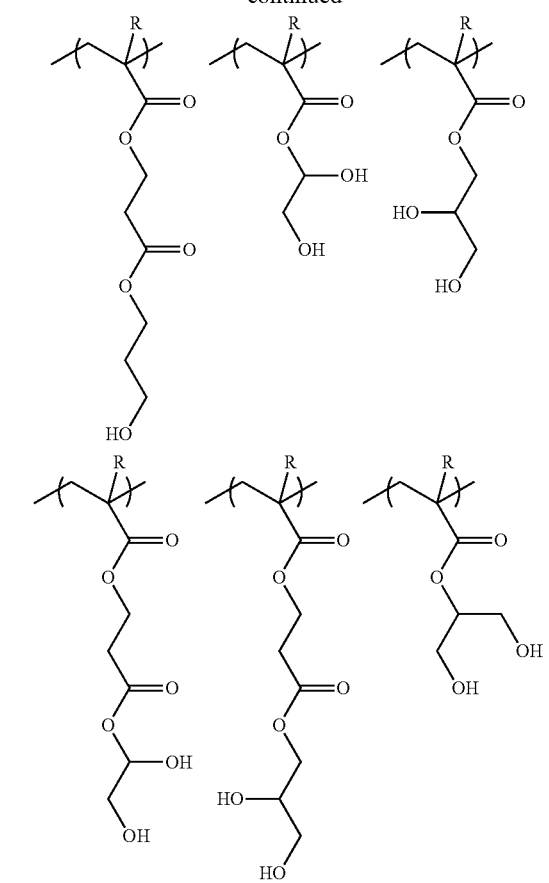
[Chemical Formula 54]
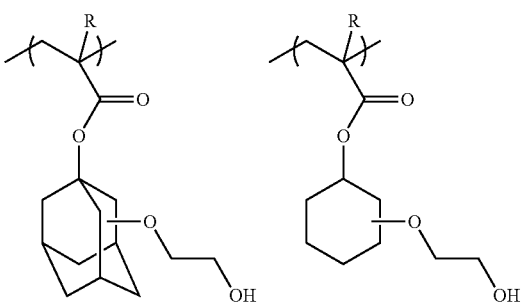
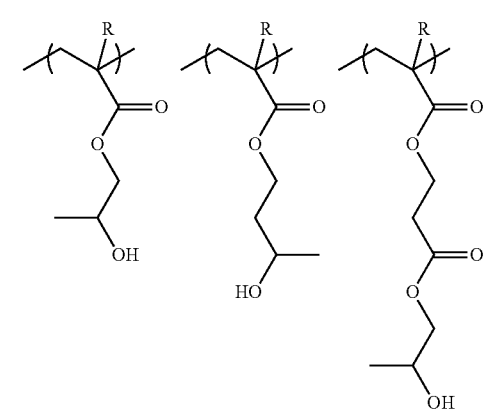
-continued
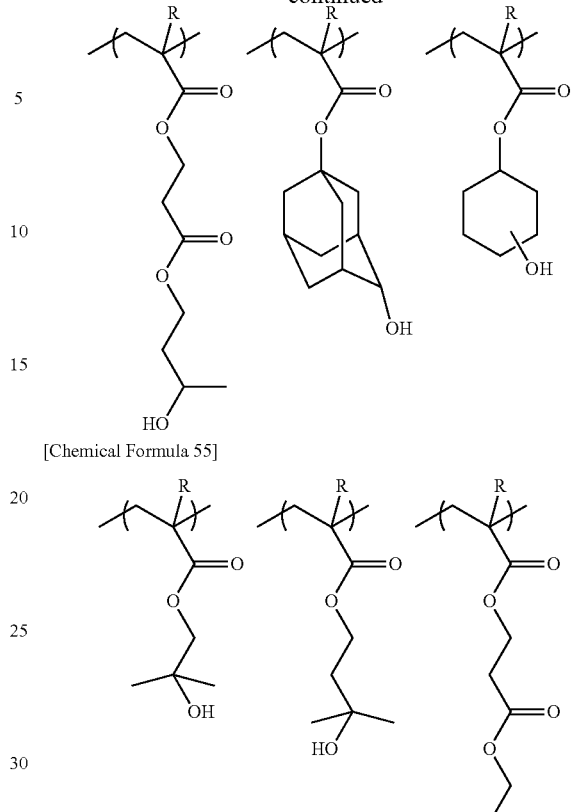
[Chemical Formula 55]
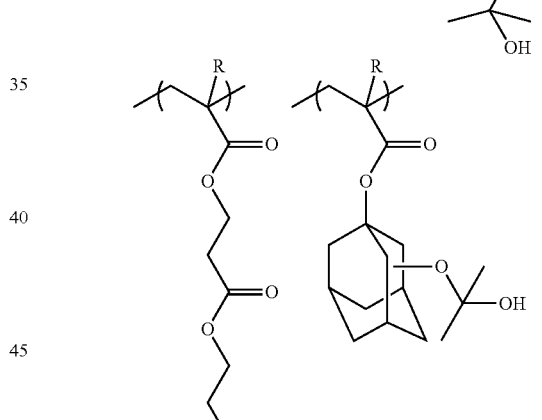
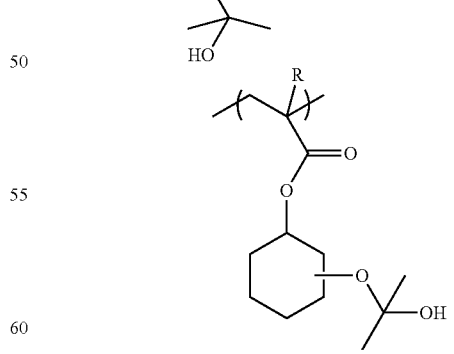
In the component (C), as the structural unit (c0), one type of structural unit may be used alone, or two or more types of structural units may be used in combination.
There are no particular limitations on the amount of the structural unit (c0) within the component (C), provided the amount is at least 1 mol % of the combined total of all the structural units that constitute the component (C). This amount may be 100 mol %. In those cases where the structural unit (c0) is combined with other structural units besides the structural unit (c0), the amount of the structural unit (c0) within the component (C), based on the combined total of all the structural units that constitute the component (C), is preferably within a range from 3 to 95 mol %, more preferably from 5 to 90 mol %, still more preferably from 20 to 85 mol %, and most preferably from 45 to 75 mol %. When the amount of the structural unit (c0) is at least as large as the lower limit of the above range, the adhesion of the resist composition to a support such as a substrate can be improved. On the other hand, when the amount of the structural unit (c0) is not more than the upper limit of the above range, a good balance can be achieved with the other structural units.

In the present invention, the component (C) may also include, in addition to the structural unit (c0) described above, a structural unit (c1) which is derived from an acrylate ester in which the hydrogen atom bonded to the carbon atom on the α-position may be substituted with a substituent, and contains an acid-degradable group that exhibits increased polarity under the action of acid. Including the structural unit (c1) in the component (C) enables the occurrence of scum to be further reduced.

Examples of the structural unit (c1) include the same structural units as those described above for the structural unit (a1). As the structural unit (c1), a structural unit represented by the above formula (a1-1) is preferred, and a structural unit represented by the above formula (a1-1-01) or (a1-1-02) is particularly desirable.

In the component (C), as the structural unit (c1), one type of structural unit may be used alone, or two or more types of structural units may be used in combination.

In the component (C), the amount of the structural unit (c1) is preferably within a range from 1 to 70 mol %, more preferably from 3 to 60 mol %, and still more preferably from 5 to 55 mol %. When the amount of the structural unit (c1) is at least as large as the lower limit of the above range, the occurrence of scum can be further reduced. On the other hand, when the amount of the structural unit (c1) is not more than the upper limit of the above range, a good balance can be achieved with the other structural units, enabling improved adhesion of the resist composition to a support such as a substrate.

The component (C) may also include other structural units besides the above structural units (c0) and (c1) (hereinafter referred to as "structural unit (c2)"), provided the inclusion of the structural unit (c2) does not impair the effects of the present invention.

There are no particular limitations on the structural unit (c2), and any structural unit which cannot be classified as one of the above structural units (c0) and (c1) may be used. For example, any of the multitude of conventional structural units used within resist resins for ArF excimer lasers, KrF excimer lasers, EUV or EB may be used.

Specific examples of the structural unit (c2) include (meth)acrylate esters having a chain-like alkyl group, an alkoxy group or a monocyclic cycloalkyl group, such as methyl (meth)acrylate, ethyl(meth)acrylate, n-propyl(meth)acrylate, n-butyl (meth)acrylate, 2-methylpropyl(meth)acrylate, 1-methylpropyl(meth)acrylate, t-butyl (meth)acrylate, cyclopropyl(meth)acrylate, cyclopentyl(meth)acrylate, cyclohexyl (meth)acrylate, 4-methoxycyclohexyl(meth)acrylate, 2-cyclopentyloxycarbonylethyl (meth)acrylate, 2-cyclohexyloxycarbonylethyl(meth)acrylate and 2-(4-methoxycyclohexyl)oxycarbonylethyl(meth)acrylate. Structural units represented by formula (c2-1) shown below are preferred. In formula (c2-1), $R^{98}$ represents an alkyl group or alkoxy group of 1 to 5 carbon atoms, and specific examples include a methyl group, ethyl group, methoxy group and ethoxy group.

[Chemical Formula 56]

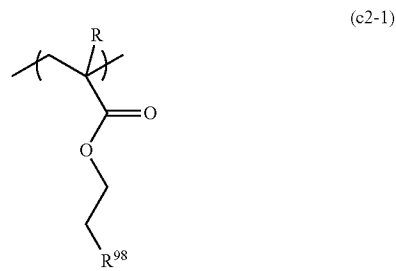

(c2-1)

In the formula, R is the same as defined above, and $R^{98}$ represents an alkyl group or alkoxy group of 1 to 5 carbon atoms.

In the component (C), as the structural unit (c2), one type of structural unit may be used alone, or two or more types of structural units may be used in combination.

In the component (C), the amount of the structural unit (c2) is preferably within a range from 0 to 95 mol %, more preferably from 5 to 90 mol %, and still more preferably from 10 to 50 mol %. When the amount of the structural unit (c2) is at least as large as the lower limit of the above range, the lithography properties improve. On the other hand, when the amount of the structural unit (c2) is not more than the upper limit of the above range, the adhesion of the resist composition to a support such as a substrate is improved.

In the present invention, the component (C) is preferably a polymeric compound containing a combination of structural units represented by one of the general formulas (C-1) to (C-3) shown below. In the following general formulas, R, Q, $R^{12}$, h, $A^{01}$ and p0 are each the same as defined above, and the plurality of R groups within each formula may be the same or different from each other.

[Chemical Formula 57]

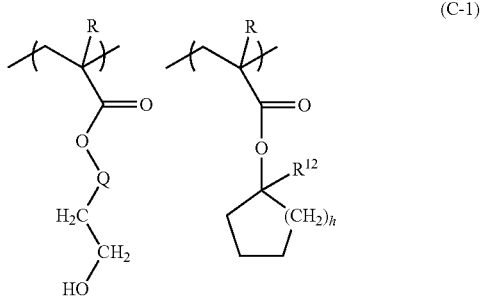

(C-1)

-continued

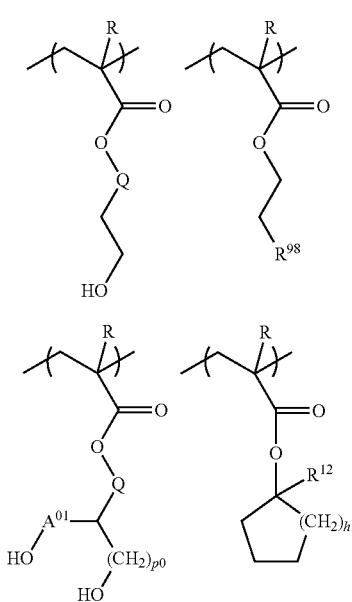

(C-2)

(C-3)

The weight-average molecular weight (Mw) (the polystyrene equivalent value determined by gel permeation chromatography) of the component (C) is not particularly limited, but is preferably within a range from 10,000 to 500,000, more preferably from 25,000 to 450,000, and still more preferably from 50,000 to 350,000. When the weight-average molecular weight is no higher than the upper limit of the above range, the occurrence of scum can be significantly reduced. On the other hand, when the weight-average molecular weight is at least as large as the lower limit of the above range, the adhesion of the resist composition to a support such as a substrate is significantly improved.

Further, although there are no particular limitations on the dispersity (Mw/Mn) of the component (C), the dispersity is preferably within a range from 1.0 to 5.0, more preferably from 1.0 to 3.0, and most preferably from 1.2 to 2.5. Here, Mn represents the number-average molecular weight.

The component (C) can be obtained, for example, by a conventional radical polymerization or the like of the monomers corresponding with each of the structural units, using a radical polymerization initiator such as azobisisobutyronitrile (AIBN).

The structure of the compound synthesized using such a conventional method can be confirmed by general organic analysis methods such as $^1$H nuclear magnetic resonance (NMR) spectrometry, $^{13}$C-NMR spectrometry, $^{19}$F-NMR spectrometry, infrared (IR) absorption spectrometry, mass spectrometry (MS), elemental analysis methods, and X-ray crystal diffraction analysis.

In the resist composition of the present invention, the amount of the component (C), relative to 100 parts by weight of the component (A), is typically less than 25 parts by weight, preferably within a range from 0.05 to 20 parts by weight, more preferably from 0.1 to 5 parts by weight, and still more preferably from 0.2 to 1 part by weight. When the amount of the component (C) is no more than the upper limit of the above range, the occurrence of scum can be reduced and the lithography properties can be improved. On the other hand, when the amount of the component (C) is at least as large as the lower limit of the above range, the adhesion of the resist composition to a support such as a substrate can be improved.

<Optional Components>

The resist composition of the present invention preferably also includes a nitrogen-containing organic compound (D) (hereinafter referred to as "component (D)") as an optional component.

There are no particular limitations on the component (D) provided it functions as an acid diffusion control agent, namely, a quencher which traps the acid generated from the component (B) upon exposure. A multitude of these components (D) have already been proposed, and any of these known compounds may be used. Examples of these conventional compounds include amines such as aliphatic amines and aromatic amines, and of these, an aliphatic amine, and particularly a secondary aliphatic amine or tertiary aliphatic amine, is preferable.

An "aliphatic amine" is an amine having one or more aliphatic groups, wherein each of the aliphatic groups preferably contains 1 to 12 carbon atoms.

Examples of these aliphatic amines include amines in which at least one hydrogen atom of ammonia ($NH_3$) has been substituted with an alkyl group or hydroxyalkyl group of not more than 12 carbon atoms (namely, alkylamines or alkyl alcohol amines), and cyclic amines.

Specific examples of the alkylamines and alkyl alcohol amines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine and tri-n-dodecylamine, and alkyl alcohol amines such as diethanolamine, triethanolamine, diisopropanolamine, triisopropanolamine, di-n-octanolamine and tri-n-octanolamine. Among these, trialkylamines of 5 to 10 carbon atoms are preferable, and tri-n-pentylamine or tri-n-octylamine is particularly desirable.

Examples of the cyclic amine include heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, tris [2-{2-(2-hydroxyethoxy)ethoxy}ethyl]amine and triethanolamine triacetate, and of these, triethanolamine triacetate is preferred.

Examples of the aromatic amines include aniline, pyridine, 4-dimethylaminopyridine, pyrrole, indole, pyrazole, imidazole and derivatives thereof, diphenylamine, triphenylamine, tribenzylamine, 2,6-diisopropylaniline and N-tert-butoxycarbonyl pyrrolidine.

As the component (D), one of these compounds may be used alone, or two or more different compounds may be used in combination.

The component (D) is typically used in an amount within a range from 0.01 to 5.0 parts by weight, relative to 100 parts by weight of the component (A). When the amount of the component (D) is within the above range, the shape of the resist pattern and the post exposure stability of the latent image formed by the pattern-wise exposure of the resist layer are improved.

Furthermore, in the resist composition of the present invention, for the purposes of preventing any deterioration in sensitivity, and improving the resist pattern shape and the post exposure stability of the latent image formed by the patternwise exposure of the resist layer, at least one compound (E) (hereinafter referred to as "component (E)") selected from the group consisting of organic carboxylic acids, and phosphorus oxo acids and derivatives thereof may also be added.

Examples of the organic carboxylic acids include acetic acid, malonic acid, citric acid, malic acid, succinic acid, benzoic acid and salicylic acid.

Examples of the phosphorus oxo acids include phosphoric acid, phosphonic acid and phosphinic acid. Among these, phosphonic acid is particularly desirable.

Examples of the phosphorus oxo acid derivatives include esters in which a hydrogen atom within an aforementioned oxo acid is substituted with a hydrocarbon group. Examples of the hydrocarbon group include alkyl groups of 1 to 5 carbon atoms and aryl groups of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinate esters and phenylphosphinic acid.

Salicylic acid is particularly preferred as the component (E).

As the component (E), one compound may be used alone, or two or more different compounds may be used in combination.

The component (E) is typically used in an amount within a range from 0.01 to 5.0 parts by weight relative to 100 parts by weight of the component (A).

If desired, other miscible additives may also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The resist composition of the present invention can be prepared by dissolving the materials for the resist composition in an organic solvent (hereinafter frequently referred to as "component (S)").

The component (S) may be any organic solvent which can dissolve each of the components used to give a uniform solution, and one or more types of organic solvent may be selected appropriately from those solvents that have been conventionally known as solvents for a chemically amplified resists.

Examples include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives, including compounds having an ester bond such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene; and dimethylsulfoxide (DMSO).

These organic solvents may be used individually, or within a mixed solvent containing two or more solvents.

Among the above solvents, propylene glycol monomethyl ether acetate (PGMEA), propylene glycol monomethyl ether (PGME) and ethyl lactate (EL) are preferred.

Further, among the mixed solvents, a mixed solvent obtained by mixing PGMEA with a polar solvent is preferable. The mixing ratio (weight ratio) of the mixed solvent may be determined as appropriate, with due consideration of the compatibility of the PGMEA with the polar solvent, but is preferably within a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

According to the present invention, a resist composition can be obtained that exhibits improved adhesion of the resist composition to a support such as a substrate, improved lithography properties, and a reduction in the occurrence of scum.

Although the reasons that the above effects are obtained are not entirely clear, it is thought that by including the structural unit (c0) having a primary or secondary alcoholic hydroxyl group, or a chain-like tertiary alcoholic hydroxyl group, the polar alcoholic hydroxyl groups are able to bind strongly to the support such as a substrate, making it less likely that the resist composition will detach due to the effects of the developing solution or the like (that is, improved adhesion). Further, it is also thought that this improvement in the adhesion reduces the occurrence of scum caused by detached portions of the resist composition, thus yielding improved lithography properties.

Method of Forming Resist Pattern

The method of forming a resist pattern according to the second aspect of the present invention includes: forming a resist film on a support using the resist composition according to the first aspect of the present invention described above, conducting exposure of the resist film, and developing the resist film to form a resist pattern.

The method of forming a resist pattern according to the present invention can be performed, for example, as follows.

Firstly, the resist composition described above is applied onto a support using a spinner or the like, and a prebake (post applied bake (PAB)) treatment is conducted under temperature conditions of 80 to 150° C. for 40 to 120 seconds, and preferably 60 to 90 seconds, to form a resist film. Subsequently, for example, using an electron beam lithography apparatus or the like, the resist film is subjected to selective exposure with an electron beam (EB) through a desired mask pattern, and post exposure baking (PEB) is then conducted under temperature conditions of 80 to 150° C. for 40 to 120 seconds, and preferably 60 to 90 seconds. The resist film is then subjected to a developing treatment.

In the case of an alkali developing process, an alkali developing treatment is performed using an alkali developing solution such as a 0.1 to 10% by weight aqueous solution of tetramethylammonium hydroxide (TMAH).

Further, in the case of a solvent developing process, the developing treatment is performed using an organic solvent. As this organic solvent, any solvent that is capable of dissolving the component (A) (namely, the component (A) prior to exposure) may be used, and the solvent may be selected appropriately from conventional organic solvents. Examples of the organic solvent include polar solvents such as ketone solvents, ester solvents, alcohol solvents, amide solvents and ether solvents, as well as hydrocarbon solvents. Among these, ester solvents are preferable. Butyl acetate is particularly preferred as the ester solvent.

Following the developing treatment, a rinse treatment is preferably performed. In the case of an alkali developing process, a water rinse using pure water is preferable. In the case of a solvent developing process, the use of a rinse solution containing the type of organic solvent listed above is preferred.

Subsequently, drying is performed. If required, a bake treatment (post bake) may be conducted following the developing treatment. In this manner, a resist pattern that is faithful to the mask pattern can be obtained.

There are no particular limitations on the support, and a conventionally known support may be used. For example, substrates for electronic components, and such substrates having wiring patterns formed thereon can be used. Specific examples of the material of the support include metals such as silicon wafer, copper, chromium, iron and aluminum, as well as and glass. Suitable materials for the wiring pattern include copper, aluminum, nickel, and gold.

Further, as the support, any one of the above-mentioned substrates that has been provided with at least one film selected from the group consisting of inorganic films and organic films on the surface thereof may also be used. As the inorganic film, an inorganic antireflection film (inorganic BARC) can be used. As the organic film, an organic antireflection film (organic BARC) can be used.

There are no particular limitations on the wavelength used for exposure provided the wavelength is 193 nm or shorter, and for example, the exposure may be conducted using radiation such as an ArF excimer laser, $F_2$ excimer laser, extreme ultraviolet radiation (EUV), vacuum ultraviolet radiation (VUV), electron beam (EB), X-rays and soft X-rays. The resist composition of the present invention is more effective for use with an ArF excimer laser, EB or EUV, and is particularly effective for use with an ArF excimer laser.

The exposure of the resist film may employ either a general exposure method (dry exposure) conducted in air or an inert gas such as nitrogen, or a liquid immersion lithography method.

In liquid immersion lithography, exposure is conducted in a state where the region between the lens and the resist film formed on the wafer, which is conventionally filled with air or an inert gas such as nitrogen, is filled with a solvent (an immersion medium) that has a larger refractive index than the refractive index of air.

More specifically, in liquid immersion lithography, the region between the resist film formed in the aforementioned manner and the lens at the lowermost portion of the exposure apparatus is filled with a solvent (an immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film to be subjected to immersion exposure. The refractive index of the immersion medium is not particularly limited as long at it satisfies these requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

EXAMPLES

A more detailed description of the present invention is presented below based on a series of examples, although the present invention is in no way limited by these examples.

Examples 1 to 4, Comparative Examples 1 to 3

The components shown in Table 1 were mixed together and dissolved to prepare a series of positive resist compositions.

TABLE 1

|  | Component (A) | Component (B) | | Component (C) | Component (D) | Component (E) | Component (S) |
|---|---|---|---|---|---|---|---|
| Example 1 | (A)-1 | (B)-1 | (B)-2 | (C)-1 | (D)-1 | (E)-1 | (S)-1 |
|  | [100] | [1.93] | [3.50] | [0.2] | [0.68] | [0.41] | [1150] |
| Example 2 | (A)-1 | (B)-1 | (B)-2 | (C)-2 | (D)-1 | (E)-1 | (S)-1 |
|  | [100] | [1.93] | [3.50] | [0.2] | [0.68] | [0.41] | [1150] |
| Example 3 | (A)-1 | (B)-1 | (B)-2 | (C)-3 | (D)-1 | (E)-1 | (S)-1 |
|  | [100] | [1.93] | [3.50] | [0.2] | [0.68] | [0.41] | [1150] |
| Comparative Example 1 | (A)-1 | (B)-1 | (B)-2 | (C)-A | (D)-1 | (E)-1 | (S)-1 |
|  | [100] | [1.93] | [3.50] | [0.2] | [0.68] | [0.41] | [1150] |
| Comparative | (A)-1 | (B)-1 | (B)-2 | (C)-B | (D)-1 | (E)-1 | (S)-1 |

TABLE 1-continued

| | Component (A) | Component (B) | | Component (C) | Component (D) | Component (E) | Component (S) |
|---|---|---|---|---|---|---|---|
| Example 2 | [100] | [1.93] | [3.50] | [0.2] | [0.68] | [0.41] | [1150] |
| Example 4 | (A)-1 | (B)-1 | (B)-2 | (C)-4 | (D)-1 | (E)-1 | (S)-1 |
| | [100] | [1.93] | [3.50] | [0.2] | [0.68] | [0.41] | [1150] |
| Comparative Example 3 | (A)-1 | (B)-1 | (B)-2 | (C)-C | (D)-1 | (E)-1 | (S)-1 |
| | [100] | [1.93] | [3.50] | [0.2] | [0.68] | [0.41] | [1150] |

The reference characters in Table 1 have the following meanings. Further, the numerical values in brackets [ ] indicate the amount (in terms of parts by weight) of the component added.

(A)-1: a polymeric compound (A)-1 shown below
(B)-1: a compound (B)-1 shown below
(B)-2: a compound (B)-2 shown below
(C)-1: a compound (C)-0 shown below, in which l/m=60/40 (molar ratio), Mw=100,000 and Mw/Mn=2.42.
(C)-2: a compound (C)-2 shown below
(C)-3: a compound (C)-3 shown below
(C)-4: a compound (C)-4 shown below
(C)-A: a compound (C)-A shown below
(C)-B: a compound (C)-B shown below
(C)-C: a compound (C)-C shown below
(D)-1: tri-n-pentylamine
(E)-1: salicylic acid
(S)-1: a mixed solvent of PGMEA/PGME=60/40 (weight ratio)

[Chemical Formula 58]

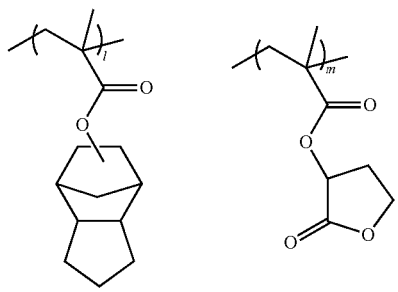

(A)-1

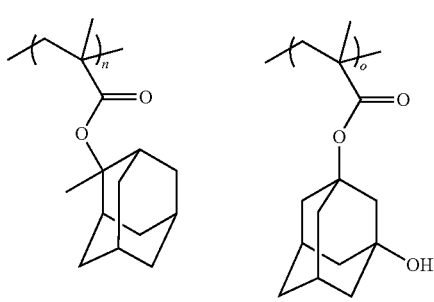

l/m/n/o=5/40/40/15 (molar ratio), Mw=14,000, Mw/Mn=1.70.

[Chemical Formula 59]

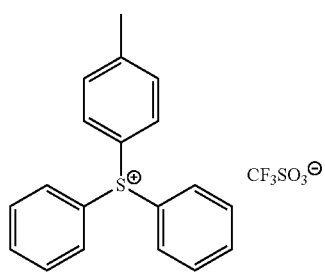

(B)-1

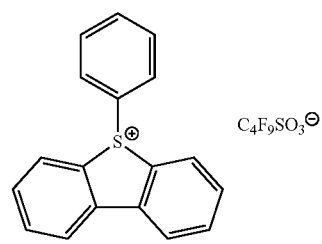

(B)-2

[Chemical Formula 60]

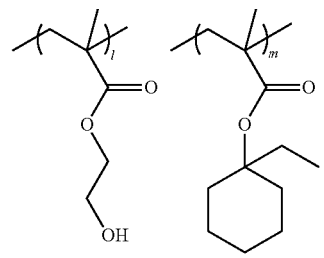

(C)-0

[Chemical Formula 61]

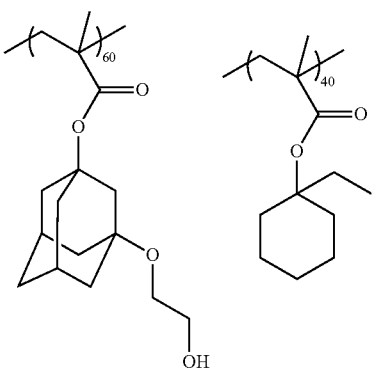

(C)-2

Mw=100,000, Mw/Mn=2.16, wherein the subscript numerals shown to the bottom right of the parentheses ( ) indicate the copolymer composition ratio (molar ratio).

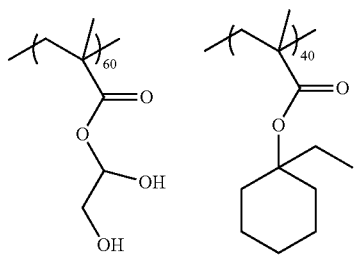

(C)-3

Mw=100,000, Mw/Mn=2.3, wherein the subscript numerals shown to the bottom right of the parentheses ( ) indicate the copolymer composition ratio (molar ratio).

[Chemical Formula 63]

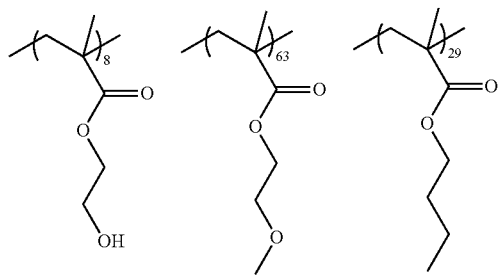

(C)-4

Mw=140,000, Mw/Mn=2.05, wherein the subscript numerals shown to the bottom right of the parentheses ( ) indicate the copolymer composition ratio (molar ratio).

[Chemical Formula 64]

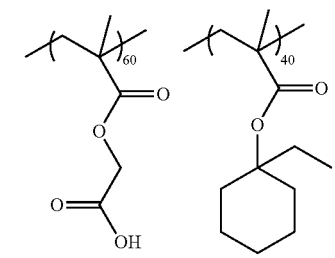

(C)-A

Mw=100,000, Mw/Mn=2.45, wherein the subscript numerals shown to the bottom right of the parentheses ( ) indicate the copolymer composition ratio (molar ratio).

[Chemical formula 65]

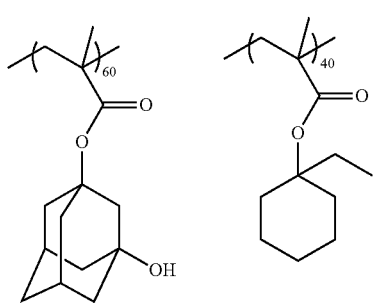

(C)-B

Mw=100,000, Mw/Mn=1.98, wherein the subscript numerals shown to the bottom right of the parentheses ( ) indicate the copolymer composition ratio (molar ratio).

[Chemical Formula 66]

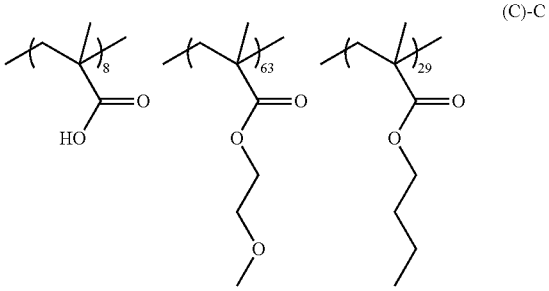

(C)-C

Mw=140,000, Mw/Mn=1.89, wherein the subscript numerals shown to the bottom right of the parentheses ( ) indicate the copolymer composition ratio (molar ratio).

[Resist Pattern Formation 1]

Each of the resist compositions described above was applied onto an 8-inch silicon wafer using a spinner, and the composition was subjected to a prebake (PAB) treatment on a hot plate at 110° C. for 60 seconds and then dried, thus forming a resist film having a thickness of 350 nm.

Subsequently, using an ArF exposure apparatus NSR-5302A (manufactured by Nikon Corporation, NA (numerical aperture)=0.60, σ=0.75), the resist film was selectively irradiated with an ArF excimer laser (193 nm) through a mask pattern. In order to perform the developing defects evaluation described below, the irradiation was performed using an excessive irradiation dose known as an overdose. Next, a post exposure bake (PEB) treatment was conducted at 120° C. for 60 seconds, and the resist film was then developed for 30 seconds at 23° C. in a 2.38% by weight aqueous solution of tetramethylammonium hydroxide (TMAH) NMD-3 (manufactured by Tokyo Ohka Kogyo Co., Ltd.). The resist film was then rinsed for 30 seconds with pure water, shaken dry, and subjected to a postbake at 100° C. for 60 seconds.

As a result, in each of the examples 1 to 4, a line and space (1:1) resist pattern (LS pattern) having a line width of 350 nm and a pitch of 700 nm was formed in the resist film (with good adhesion). In contrast, in the comparative examples 1 to 3, the resist film detached from the substrate during developing, and a pattern was not able to be formed (indicating poor adhesion). Compositions having good adhesion were evaluated as A, and compositions having poor adhesion were evaluated as B. The results are shown in Table 2.

[Evaluation of Developing Defects]

For each of the 350 nm 1:1 LS patterns obtained above, an image of the pattern obtained using a measuring SEM (product name: S-9220, manufactured by Hitachi, Ltd.) was inspected visually to ascertain the occurrence of surface developing defects. The results of evaluating the developing defects against the following criteria are shown in Table 2.

A: visual evaluation revealed no developing defects

A': visual evaluation revealed 1 or 2 developing defects

B: visual evaluation revealed 3 to 5 developing defects

D: visual evaluation revealed 6 or more developing defects

[Evaluation of Lithography Properties]

Using the image obtained in the above "Evaluation of Developing Defects" using a measuring SEM (product name: S-9220, manufactured by Hitachi, Ltd.), the image was inspected for the occurrence of partial pattern detachment and to confirm the line shape. The results of evaluating these lithography properties against the following criteria are shown in Table 2.

A: no pattern detachment
B: partial pattern detachment
C: pattern detachment, and incomplete line shape in places

TABLE 2

|  | Adhesion | Developing defects | Lithography properties |
|---|---|---|---|
| Example 1 | A | A | A |
| Example 2 | A | A | A |
| Example 3 | A | A | A |
| Comparative Example 1 | B | — | — |
| Comparative Example 2 | B | — | — |
| Example 4 | A | A' | A |
| Comparative Example 3 | B | — | — |

Based on the results in Table 2, it was evident that compared with the resist compositions of the comparative examples 1 to 3, the resist compositions of the examples 1 to 4 exhibited good adhesion, and were able to form resist patterns. Further, it was also confirmed that when the resist compositions of the examples 1 to 4 were used, developing defects were minimal, and the lithography properties were excellent.

Examples 5 to 10, Comparative Examples 4 to 6

The components shown in Table 3 were mixed together and dissolved to prepare a series of positive resist compositions.

TABLE 3

|  | Component (A) | Component (B) | Component (C) | Component (D) | Component (E) | Component (S) |
|---|---|---|---|---|---|---|
| Comparative Example 4 | (A)-1 [100] | (B)-1 [1.93] | (B)-2 [3.50] | — | (D)-1 [0.68] | (E)-1 [0.41] | (S)-1 [1150] |
| Example 5 | (A)-1 [100] | (B)-1 [1.93] | (B)-2 [3.50] | (C)-5 [0.05] | (D)-1 [0.68] | (E)-1 [0.41] | (S)-1 [1150] |
| Example 6 | (A)-1 [100] | (B)-1 [1.93] | (B)-2 [3.50] | (C)-5 [0.2] | (D)-1 [0.68] | (E)-1 [0.41] | (S)-1 [1150] |
| Example 7 | (A)-1 [100] | (B)-1 [1.93] | (B)-2 [3.50] | (C)-5 [1.0] | (D)-1 [0.68] | (E)-1 [0.41] | (S)-1 [1150] |
| Example 8 | (A)-1 [100] | (B)-1 [1.93] | (B)-2 [3.50] | (C)-5 [5.0] | (D)-1 [0.68] | (E)-1 [0.41] | (S)-1 [1150] |
| Example 9 | (A)-1 [100] | (B)-1 [1.93] | (B)-2 [3.50] | (C)-5 [10.0] | (D)-1 [0.68] | (E)-1 [0.41] | (S)-1 [1150] |
| Example 10 | (A)-1 [100] | (B)-1 [1.93] | (B)-2 [3.50] | (C)-5 [20.0] | (D)-1 [0.68] | (E)-1 [0.41] | (S)-1 [1150] |
| Comparative Example 5 | (A)-1 [100] | (B)-1 [1.93] | (B)-2 [3.50] | (C)-5 [30.0] | (D)-1 [0.68] | (E)-1 [0.41] | (S)-1 [1150] |
| Comparative Example 3 | (A)-1 [100] | (B)-1 [1.93] | (B)-2 [3.50] | (C)-5 [40.0] | (D)-1 [0.68] | (E)-1 [0.41] | (S)-1 [1150] |

Of the reference characters used in Table 3, (A)-1, (B)-1 and (B)-2, (D)-1, (E)-1, and (S)-1 are each the same as defined above. (C)-5 represents a compound described below. Further, the numerical values in brackets [ ] indicate the amount (in terms of parts by weight) of the component added.

(C)-5: the aforementioned compound (C)-0, in which l/m=60/40 (molar ratio), Mw=60,000 and Mw/Mn=1.77.

[Resist Pattern Formation 2]

Each of the resist compositions was used to form a resist pattern using the same procedure as that described above in "Resist Pattern Formation 1".

As a result, with the exception of the comparative example 4, a line and space (1:1) resist pattern (LS pattern) having a line width of 350 nm and a pitch of 700 nm was formed in each resist film (with good adhesion). Compositions having good adhesion were evaluated as A, and compositions having poor adhesion were evaluated as B. The results are shown in Table 4.

Further, evaluations of the developing defects and the lithography properties were performed in the same manner as described above. The results are shown in Table 4.

TABLE 4

|  | Adhesion | Developing defects | Lithography properties |
|---|---|---|---|
| Comparative Example 4 | B | — | — |
| Example 5 | A | A | A |
| Example 6 | A | A | A |
| Example 7 | A | A | A |
| Example 8 | A | A' | B |
| Example 9 | A | B | B |
| Example 10 | A | B | B |
| Comparative Example 5 | A | D | C |
| Comparative Example 6 | A | D | C |

Based on the results in Table 4 it was confirmed that the resist compositions of the examples 5 to 10 exhibited superior adhesion compared with the resist composition of the comparative example 4, and exhibited fewer developing defects and superior lithography properties compared with the resist compositions of the comparative examples 4 to 6.

Examples 11 to 15

The components shown in Table 5 were mixed together and dissolved to prepare a series of positive resist compositions.

TABLE 5

| | Component (A) | Component (B) | | Component (C) | Component (D) | Component (E) | Component (S) | Adhesion | Developing defects | Properties |
|---|---|---|---|---|---|---|---|---|---|---|
| Example 11 | (A)-1 [100] | (B)-1 [1.93] | (B)-2 [3.50] | (C)-6 [0.2] | (D)-1 [0.68] | (E)-1 [0.41] | (S)-1 [1150] | A | A | B |
| Example 12 | (A)-1 [100] | (B)-1 [1.93] | (B)-2 [3.50] | (C)-7 [0.2] | (D)-1 [0.68] | (E)-1 [0.41] | (S)-1 [1150] | A | A | A |
| Example 13 | (A)-1 [100] | (B)-1 [1.93] | (B)-2 [3.50] | (C)-8 [0.2] | (D)-1 [0.68] | (E)-1 [0.41] | (S)-1 [1150] | A | A | A |
| Example 14 | (A)-1 [100] | (B)-1 [1.93] | (B)-2 [3.50] | (C)-9 [0.2] | (D)-1 [0.68] | (E)-1 [0.41] | (S)-1 [1150] | A | A | A |
| Example 15 | (A)-1 [100] | (B)-1 [1.93] | (B)-2 [3.50] | (C)-10 [0.2] | (D)-1 [0.68] | (E)-1 [0.41] | (S)-1 [1150] | A | D | A |

Of the reference characters used in Table 5, (A)-1, (B)-1 and (B)-2, (D)-1, (E)-1, and (S)-1 are each the same as defined above. (C)-6 to (C)-10 represent compounds described below. Further, the numerical values in brackets [ ] indicate the amount (in terms of parts by weight) of the component added.

(C)-6: the aforementioned compound (C)-0, in which l/m=60/40 (molar ratio), Mw=10,000 and Mw/Mn=1.58.

(C)-7: the aforementioned compound (C)-0, in which l/m=60/40 (molar ratio), Mw=25,000 and Mw/Mn=1.66.

(C)-8: the aforementioned compound (C)-0, in which l/m=60/40 (molar ratio), Mw=60,000 and Mw/Mn=1.77.

(C)-9: the aforementioned compound (C)-0, in which l/m=60/40 (molar ratio), Mw=110,000 and Mw/Mn=2.42.

(C)-10: the aforementioned compound (C)-0, in which l/m=60/40 (molar ratio), Mw=300,000 and Mw/Mn=2.51.

[Resist Pattern Formation 3]

Each of the above resist compositions was used to form a resist pattern using the same procedure as that described above in "Resist Pattern Formation 1".

As a result, a line and space (1:1) resist pattern (LS pattern) having a line width of 350 nm and a pitch of 700 nm was formed in each resist film (with good adhesion).

Further, evaluations of the developing defects and the lithography properties (listed as simply "properties" in Table 5) were performed in the same manner as described above. The results are shown in Table 5.

Based on the results in Table 5, it was confirmed that the resist compositions of the examples 11 to 15 all exhibited good adhesion, the resist compositions of the examples 11 to 14 exhibited minimal developing defects, and the resist compositions of the examples 12 to 15 exhibited particularly superior lithography properties. These results confirmed that when the molecular weight of the component (C) is large, the adhesion is particularly favorable, whereas when the molecular weight is small, the reduction in developing defects is particularly favorable.

Examples 16 to 18

The components shown in Table 6 were mixed together and dissolved to prepare a series of positive resist compositions.

TABLE 6

| | Component (A) | Component (B) | | Component (C) | Component (D) | Component (E) | Component (S) | Adhesion | Developing defects | Properties |
|---|---|---|---|---|---|---|---|---|---|---|
| Example 16 | (A)-1 [100] | (B)-1 [1.93] | (B)-2 [3.50] | (C)-11 [0.2] | (D)-1 [0.68] | (E)-1 [0.41] | (S)-1 [1150] | A | A | A |
| Example 17 | (A)-1 [100] | (B)-1 [1.93] | (B)-2 [3.50] | (C)-12 [0.2] | (D)-1 [0.68] | (E)-1 [0.41] | (S)-1 [1150] | A | A | A |
| Example 18 | (A)-1 [100] | (B)-1 [1.93] | (B)-2 [3.50] | (C)-13 [0.2] | (D)-1 [0.68] | (E)-1 [0.41] | (S)-1 [1150] | A | A | B |

Of the reference characters used in Table 6, (A)-1, (B)-1 and (B)-2, (D)-1, (E)-1, and (S)-1 are each the same as defined above. (C)-11 to (C)-13 represent compounds described below. Further, the numerical values in brackets [ ] indicate the amount (in terms of parts by weight) of the component added.

(C)-11: the aforementioned compound (C)-0, in which l/m=70/30 (molar ratio), Mw=50,000 and Mw/Mn=2.05.

(C)-12: the aforementioned compound (C)-0, in which l/m=60/40 (molar ratio), Mw=50,000 and Mw/Mn=1.77.

(C)-13: the aforementioned compound (C)-0, in which l/m=50/50 (molar ratio), Mw=50,000 and Mw/Mn=1.67.

[Resist Pattern Formation 4]

Each of the above resist compositions was used to form a resist pattern using the same procedure as that described above in "Resist Pattern Formation 1".

As a result, a line and space (1:1) resist pattern (LS pattern) having a line width of 350 nm and a pitch of 700 nm was formed in each resist film (with good adhesion).

Further, evaluations of the developing defects and the lithography properties (listed as simply "properties" in Table 6) were performed in the same manner as described above. The results are shown in Table 6.

Based on the results in Table 6, it was confirmed that the resist compositions of the examples 16 to 18 all exhibited good adhesion, had minimal developing defects, and exhibited superior lithography properties. Further, it was confirmed that a high proportion of the structural unit (c0) yielded particularly good adhesion. It is surmised that the lower the proportion of the structural unit (c0) is, the more significant the reduction in developing defects will become.

What is claimed is:

1. A resist composition comprising:
a base component (A) which exhibits changed solubility in a developing solution under action of acid and can be used in a lithography process that employs light having a wavelength of 193 nm or less as an exposure light source,
an acid generator component (B) which generates acid upon exposure, and
a polymeric compound (C) having a structural unit (c0) comprising at least one member selected from the group consisting of structural units represented by general formulae (c0-11), (c0-12), (c0-21), (c0-22) and (c0-3) shown below, wherein
an amount of the polymeric compound (C) is within a range of 0.05 to 5 parts by weight relative to 100 parts by weight of the base component (A), wherein the amount of the structural unit (c0), based on a combined total of all structural units that constitute the polymeric compound (C), is within a range from 45 to 95 mol %:

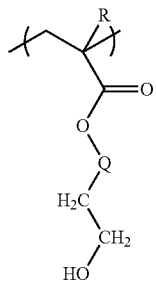
(c0-11)

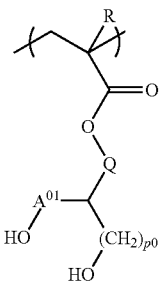
(c0-12)

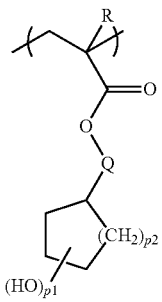
(c0-21)

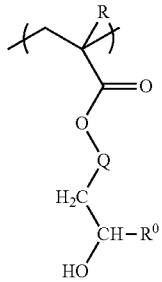
(c0-22)

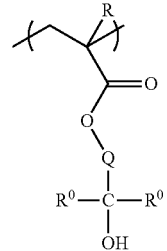
(c0-3)

wherein R represents a hydrogen atom, an alkyl group of 1 to 5 carbon atoms or a halogenated alkyl group of 1 to 5 carbon atoms, each Q independently represents a single bond, an alkylene group, a divalent aliphatic cyclic group or a divalent linking group containing a hetero atom, $A^{01}$ represents a divalent hydrocarbon group which may have a substituent, each $R^0$ independently represents an alkyl group of 1 to 5 carbon atoms, wherein a plurality of $R^0$ groups within a formula may be the same or different from each other, p0 represents an integer of 0 to 3, p1 represents an integer of 1 to 3, and p2 represents an integer of 0 to 3.

2. The resist composition according to claim 1, wherein the polymeric compound (C) further comprises a structural unit (c1), which is derived from an acrylate ester in which a hydrogen atom bonded to a carbon atom on an α-position may be substituted with a substituent, and contains an acid-degradable group that exhibits increased polarity under action of acid.

3. The resist composition according to claim 1, wherein a weight-average molecular weight of the polymeric compound (C) is within a range from 10,000 to 500,000.

4. The resist composition according to claim 1, wherein the base component (A) is a resin component (A1) that exhibits increased polarity under action of acid.

5. The resist composition according to claim 4, wherein the resin component (A1) comprises a structural unit (a1), which is derived from an acrylate ester in which a hydrogen atom bonded to a carbon atom on an α-position may be substituted with a substituent, and contains an acid-degradable group that exhibits increased polarity under action of acid.

6. The resist composition according to claim 1, further comprising a nitrogen-containing organic compound (D).

7. A method of forming a resist pattern, the method comprising: using the resist composition according to any one of claims 1, 2 and 3 to 6 to form a resist film on a support, conducting exposure of the resist film, and developing the resist film to form a resist pattern.

* * * * *